(12) United States Patent
Sakamoto et al.

(10) Patent No.: US 12,034,083 B2
(45) Date of Patent: Jul. 9, 2024

(54) NONVOLATILE STORAGE ELEMENT AND ANALOG CIRCUIT PROVIDED WITH SAME

(71) Applicant: ASAHI KASEI MICRODEVICES CORPORATION, Tokyo (JP)

(72) Inventors: Toshiro Sakamoto, Tokyo (JP); Satoshi Takehara, Tokyo (JP); Yoshiro Yamaha, Tokyo (JP); Makoto Kobayashi, Tokyo (JP)

(73) Assignee: ASAHI KASEI MICRODEVICES CORPORATION, Tokyo (JP)

( * ) Notice: Subject to any disclaimer, the term of this patent is extended or adjusted under 35 U.S.C. 154(b) by 0 days.

(21) Appl. No.: 18/108,519

(22) Filed: Feb. 10, 2023

(65) Prior Publication Data
US 2023/0197861 A1    Jun. 22, 2023

Related U.S. Application Data

(63) Continuation of application No. 16/649,175, filed as application No. PCT/JP2017/036017 on Oct. 3, 2017, now Pat. No. 11,611,000.

(51) Int. Cl.
| | |
|---|---|
| H01L 21/00 | (2006.01) |
| H01L 21/28 | (2006.01) |
| H01L 29/423 | (2006.01) |
| H01L 29/66 | (2006.01) |
| H01L 29/788 | (2006.01) |
| H10B 41/30 | (2023.01) |

(52) U.S. Cl.
CPC .... *H01L 29/7883* (2013.01); *H01L 29/40114* (2019.08); *H01L 29/42324* (2013.01); *H01L 29/66825* (2013.01); *H10B 41/30* (2023.02)

(58) Field of Classification Search
CPC .......... H01L 29/7883; H01L 29/40114; H01L 29/42324; H01L 29/66825
See application file for complete search history.

(56) References Cited

U.S. PATENT DOCUMENTS

| | | | |
|---|---|---|---|
| 4,417,263 | A | 11/1983 | Matsuura |
| 5,449,941 | A | 9/1995 | Yamazaki et al. |

(Continued)

FOREIGN PATENT DOCUMENTS

| | | |
|---|---|---|
| CN | 104425226 A | 3/2015 |
| JP | H04-65546 B2 | 10/1992 |

(Continued)

OTHER PUBLICATIONS

International Preliminary Report on Patentability dated Apr. 8, 2020, issued in corresponding International Patent Application No. PCT/JP2017/036017.

(Continued)

*Primary Examiner* — Richard A Booth
(74) *Attorney, Agent, or Firm* — MORGAN, LEWIS & BOCKIUS LLP

(57) ABSTRACT

A nonvolatile storage element includes a substrate; a gate region having a charge holding region and an insulator surrounding an entire surface of the charge holding region; a drain region formed in one of both sides of a lower portion of the gate region; and a source region formed in another one of both the sides. A halogen is distributed in the insulator to cover an entire surface of an upper surface of the charge holding region.

20 Claims, 17 Drawing Sheets

(56) References Cited

U.S. PATENT DOCUMENTS

| | | |
|---|---|---|
| 5,629,222 A | 5/1997 | Yamazaki et al. |
| 6,093,607 A | 7/2000 | Hsieh et al. |
| 9,466,387 B2 | 10/2016 | Nam et al. |
| 11,611,000 B2 * | 3/2023 | Sakamoto ......... H01L 29/42324 |
| 2002/0019097 A1 | 2/2002 | Arai et al. |
| 2002/0037640 A1 | 3/2002 | Orita |
| 2003/0206440 A1 | 11/2003 | Wong |
| 2005/0233521 A1 | 10/2005 | Park |
| 2005/0287740 A1 | 12/2005 | Wu et al. |
| 2008/0093657 A1 | 4/2008 | Son et al. |
| 2009/0146731 A1 | 6/2009 | Yoshida et al. |
| 2012/0132979 A1 | 5/2012 | Prall et al. |
| 2015/0252217 A1 * | 9/2015 | Czubarow ............... C08L 63/00 257/737 |
| 2019/0165180 A1 | 5/2019 | Chen et al. |

FOREIGN PATENT DOCUMENTS

| | | |
|---|---|---|
| JP | H05-206412 A | 8/1993 |
| JP | 2002-368107 A | 12/2002 |
| JP | 2007-142450 A | 6/2007 |
| JP | 2007-294846 A | 11/2007 |
| JP | 2013-246627 A | 12/2013 |
| JP | 2016-129293 A | 7/2016 |

OTHER PUBLICATIONS

Ushiyama, "Suppression of Anomalous Leakage Current in Tunnel Oxides by Fluorine Implantation to realize Highly Reliable Flash Memory", 1999 Symposium on VLSI Technology Digest of Technical Papers, pp. 23-24, 1999.

Supplementary European Search Report dated Sep. 15, 2020, issued in corresponding European Patent Application No. 17928063.1.

Office Action dated Oct. 6, 2020, issued in corresponding European Patent Application No. 17928063.1.

International Search Report (with partial translation) and Written Opinion issued in corresponding International Patent Application No. PCT/JP2017/036017, dated Nov. 14, 2017.

* cited by examiner

NONVOLATILE STORAGE ELEMENT AND ANALOG CIRCUIT PROVIDED WITH SAME

This application is a continuation of U.S. application Ser. No. 16/649,175, filed Mar. 20, 2020, which is a National Stage Entry of International Patent Application No. PCT/JP2017/036017, filed Oct. 3, 2017, the entirety of each of which is hereby incorporated by reference.

TECHNICAL FIELD

The present invention relates to a nonvolatile storage element and an analog circuit provided with the same.

BACKGROUND ART

In general, in a semiconductor device containing a reference voltage generation circuit, a reference voltage Vref assumed at the time of designing does not become a desired value and greatly varies in some cases due to manufacturing variations in a threshold voltage Vth of each transistor and a resistance value of a resistive element, and the like configuring the reference voltage generation circuit. Therefore, a highly accurate reference voltage generation circuit has been demanded in the semiconductor device requiring a stable reference voltage Vref. The semiconductor device is configured so that, in order to correct the reference voltage variations in the reference voltage generation circuit resulting from the manufacturing variations a large number of spare transistors adjusting the reference voltage by altering a wiring layer are built in or the reference voltage is adjustable with a laser trimmer after manufacturing. However, when the reference voltage variations in the reference voltage generation circuit are corrected by such a configuration, an increase in the layout area of the reference voltage generation circuit or an increase in man-hour and manufacturing steps for voltage adjustment poses a problem. Thus, in order to solve this kind of problem, various reference voltage generation circuits have been proposed.

PTL 1 describes a common reference voltage generation circuit. As the reference voltage generation circuit, a configuration has been proposed in which, utilizing a constant current property of a depletion type MOSFET (Metal-Oxide film-Semiconductor Field-Effect Transistor) in which a gate region G and a source region S are connected, a voltage generated in an enhancement type MOSFET in which a gate region and a drain region are connected and which operates by the constant current thereof is used as the reference voltage Vref.

FIG. 23 illustrates a common reference voltage generation circuit 100. The reference voltage generation circuit 100 is provided with a depletion type MOSFET (hereinafter referred to as "depletion type transistor") Md and an enhancement type MOSFET (hereinafter referred to as "enhancement type transistor") Me connected in series. A gate region G and a source region S of the depletion type transistor Md are connected. A gate region G and a drain region D of the enhancement type transistor Me are connected. Furthermore, the gate region G and the source region S of the depletion type transistor Md and the gate region G and the drain region D of the enhancement type transistor Me are connected. Moreover, a high voltage supply terminal Vdd is provided in the drain region D of the depletion type transistor Md and a low voltage supply terminal Vss is provided in the source region S of the enhancement type transistor Me. Moreover, a voltage output terminal OUT is provided at a connection point of the depletion type transistor Md and the enhancement type transistor Me. In the reference voltage generation circuit 100, both the depletion type transistor Md and the enhancement type transistor Me are N-channel types. The depletion type and the enhancement type are classified according to the relationship between a gate voltage and a drain current. In the depletion type, when a gate voltage is not applied to a gate region, a channel is present, so that a drain current flows. On the other hand, in the enhancement type, when a gate voltage is not applied to a gate region, a channel is not present, so that a drain current does not flow.

FIG. 24 illustrates an example of current/voltage characteristics of the depletion type transistor Md and the enhancement type transistor Me provided in the reference voltage generation circuit 100. The horizontal axis represents a gate-source voltage Vgs between the gate region G and the source region S. The vertical axis represents a drain current Ids. In the depletion type transistor Md, the gate-source voltage Vgs is fixed at 0 V, and therefore the flow of a drain current of a constant current Iconst is allowed insofar as a drain-source voltage between the drain region D and the source region S is in a saturated region. The drain current of the constant current Iconst flows also in the enhancement type transistor Me connected to the depletion type transistor Md in series. Therefore, the gate-source voltage Vgs of the enhancement type transistor Me in which Ids=Iconst is established can be extracted from the voltage output terminal OUT as the reference voltage Vref.

When a threshold voltage of the depletion type transistor Md is expressed as Vth_d and a threshold voltage of the enhancement type transistor Me is expressed as Vth_e, the reference voltage Vref is the sum of the absolute value of the threshold voltage Vth_d and the absolute value of threshold voltage Vth_e, i.e., the reference voltage Vref can be expressed by "Vref=|Vth_d|+|Vth_e|.

However, the reference voltage generation circuit 100 is affected by manufacturing variations in the current/voltage characteristics of the depletion type transistor Md and the current/voltage characteristics of the enhancement type transistor Me. Thus, as a circuit which is not affected by the manufacturing variations and which can extract a highly accurate reference voltage, PTL 2 and PTL 3 disclose reference voltage generation circuits using an FET type nonvolatile storage element. The reference voltage generation circuits disclosed in PTLs 2 and 3 have substantially the same configuration as that of the reference voltage generation circuit 100 illustrated in FIG. 23 and uses nonvolatile storage elements for the depletion type transistor Md and the enhancement type transistor Me. The reference voltage generation circuits disclosed in PTLs 2 and 3 use nonvolatile storage elements of the same type and adjust the injection amounts of charges into floating gate regions provided in the nonvolatile storage elements to thereby form the depletion type MOSFET and the enhancement type MOSFET. The nonvolatile storage element has a control gate region and the floating gate region and can control the threshold voltage Vth by injecting and emitting electrons into the floating gate region. Therefore, even when the manufacturing variations occur, the reference voltage generation circuit can perform the trimming of the threshold voltage Vth afterward. Therefore, the reference voltage Vref to be extracted is hardly affected by the manufacturing variations in the reference voltage generation circuit.

CITATION LIST

Patent Literature

PTL 1: JP H04-65546 B
PTL 2: JP 2002-368107 A
PTL 3: JP 2013-246627 A

SUMMARY OF INVENTION

Technical Problem

However, the reference voltage generation circuits disclosed in PTLs 2 and 3 require very high charge holding characteristics as compared with a case of being used for a so-called nonvolatile memory, such as EEPROM, because the nonvolatile storage elements are used in an analog manner. Furthermore, when used for an analog circuit, such as the reference voltage generation circuit, it has also been demanded that the layout dimension (for example, L dimension and W dimension of an FET) of the nonvolatile storage element is variable according to the intended use. Therefore, the flexibility for the layout dimension has been demanded as compared with a case of being used for a usual nonvolatile memory configured with a fixed layout. The flexibility for the layout dimension is a very difficult problem to be solved in having the charge holding characteristics of the nonvolatile storage element from the viewpoint of a manufacturing technology. There is a problem that a nonvolatile storage element used for a conventional nonvolatile memory is difficult to be applied to an analog circuit.

It is an object of the present invention to provide a nonvolatile storage element having excellent charge holding characteristics capable of reducing variations in electric characteristics and an analog circuit provided with the same.

Solution to Problem

In order to achieve the above-described object, a nonvolatile storage element according to one aspect of the present invention is provided with a charge holding region and an insulator surrounding the entire surface of the charge holding region and having halogen distributed in at least one part of a region surrounding the entire surface.

In order to achieve the above-described object, an analog circuit according to a first aspect of the present invention is provided with a nonvolatile storage element of the present invention.

An analog circuit according to a second aspect of the present invention is provided with two or more of the nonvolatile storage elements of the present invention, in which at least some of the two or more of the nonvolatile storage elements are connected in series and a voltage output terminal, from which a voltage is output, is connected to a connection portion of the two or more of the nonvolatile storage elements connected in series.

In order to achieve the above-described object, an analog circuit according to a third aspect of the present invention is provided with a second nonvolatile storage element having a second control gate region electrically connected to a first control gate region provided in a gate region having the charge holding region and the insulator of a first nonvolatile storage element which is the nonvolatile storage element of the present invention, a second charge holding region electrically connected to a first charge holding region which is the charge holding region of the first nonvolatile storage element, and a gate insulating film formed in contact with the second charge holding region, in which a charge inlet provided in the first nonvolatile storage element is formed in a region not in contact with a current route formed in the second nonvolatile storage element.

In order to achieve the above-described object, an analog circuit according to a fourth aspect of the present invention is provided with the nonvolatile storage element of the present invention, in which the element area of the nonvolatile storage element is 10 $\mu m^2$ or more and the nonvolatile storage element does not have an array structure.

Advantageous Effects of Invention

Each aspect of the present invention can achieve a nonvolatile storage element having excellent charge holding characteristics capable of reducing variations in electric characteristics and an analog circuit provided with the same.

BRIEF DESCRIPTION OF DRAWINGS

FIGS. 8A and 8B are cross-sectional views of the manufacturing processes (No. 6) of the nonvolatile storage elements M according to the first embodiment of the present invention, in which FIG. 8A is the cross-sectional view of the manufacturing process of the nonvolatile storage element to be used as a depletion type transistor and FIG. 8B is the cross-sectional view of the manufacturing process of the nonvolatile storage element to be used as an enhancement type transistor;

DESCRIPTION OF EMBODIMENTS

First Embodiment

A nonvolatile storage element and an analog circuit provided with the same according to a first embodiment of the present invention are described using FIGS. 1 to 17. This embodiment describes a reference voltage generation circuit using an N-type nonvolatile storage element provided with a floating gate region having an insulator containing fluoride in the periphery thereof and a control gate region as an example of the analog circuit. However, when the nonvolatile storage element is not limited to the structure and is not limited to an N-type MOSFET insofar as the nonvolatile storage element is an active element (transistor) having a charge holding region. Furthermore, the analog circuit to which the nonvolatile storage element is applied is not limited to the reference voltage generation circuit insofar as the analog circuit is a circuit using the nonvolatile storage element in an analog manner. For example, the nonvolatile storage element is effective also in analog circuits requiring accuracy in the threshold voltage of the MOSFET, such as an operational amplifier circuit or a comparator circuit.

Figure 18:
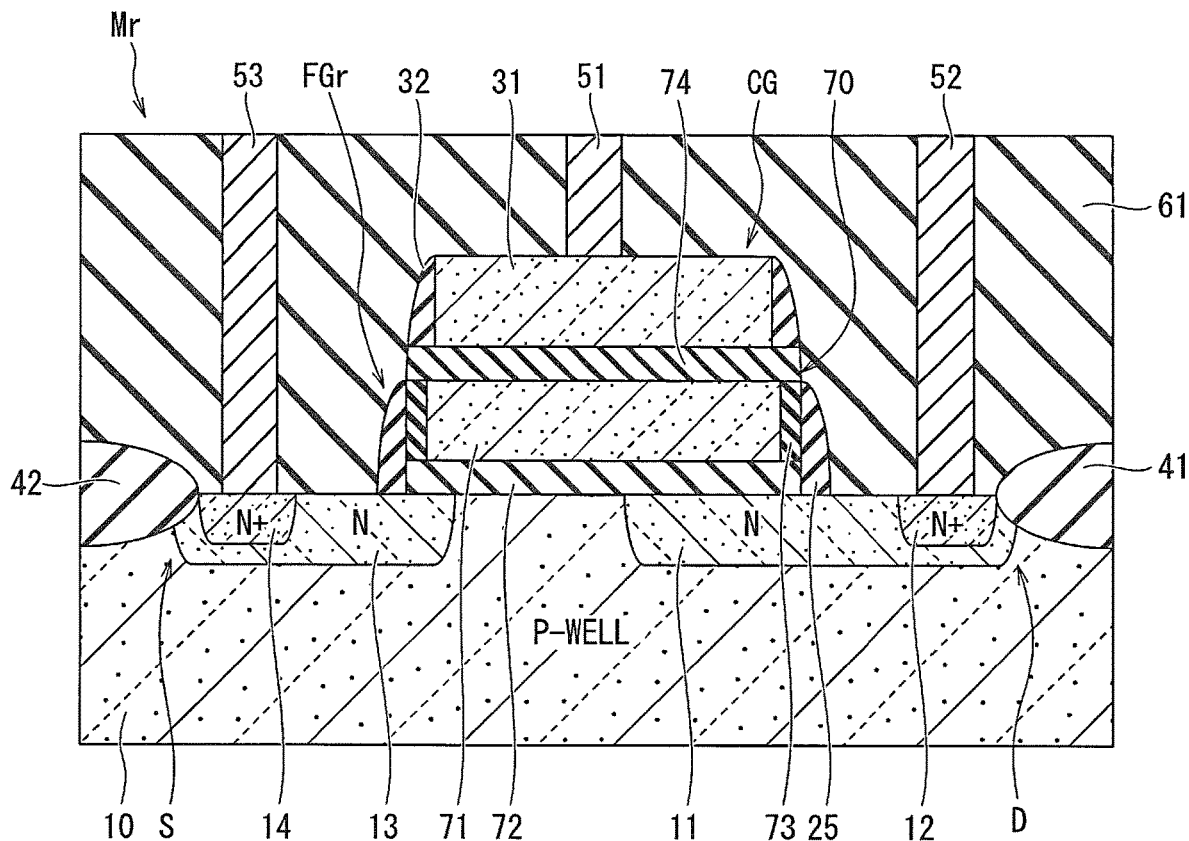
FIG. 18 is a view for explaining a nonvolatile storage element M according to a second embodiment of the present invention and is a cross-sectional view illustrating the schematic configuration of a nonvolatile storage element Mr not having a charge inlet.

As illustrated in FIG. 18, a nonvolatile storage element M provided according to this embodiment is provided with a P-well region 10 formed in a semiconductor substrate, a floating gate region FG formed on the P-well region 10, and a control gate region CG formed on the floating gate region FG. Moreover, the nonvolatile storage element M is provided with a drain region D formed in one of both sides of a lower portion of the floating gate region FG and a source region S formed in the other one of both the sides of the lower portion of the floating gate region FG. The drain region D and the source region S are formed in the P-well region 10. The nonvolatile storage element M is element-separated from the other nonvolatile storage elements (not illustrated) formed in the same semiconductor substrate by element separation regions 41 and 42.

The floating gate region FG contains a charge holding region 21 and an insulator 20. More specifically, the nonvolatile storage element M is provided with the charge holding region 21 and the insulator 20 surrounding the entire surface of the charge holding region 21 and having halogen (for example, fluorine) distributed in at least one part of a region surrounding the entire surface. In the nonvolatile storage element M according to this embodiment, the insulator 20 has the halogen distributed in at least a partial region and disposed surrounding the charge holding region 21. The insulator 20 is disposed surrounding the charge holding region 21 so that halogen elements are distributed in all directions surrounding the charge holding region 21 and has the halogen distributed in the entire region. More specifically, the halogen is distributed to surround the entire surface of the charge holding region 21 and the insulator 20 is disposed surrounding the charge holding region 21. As a result, the halogen is distributed in all directions of the charge holding region 21. The insulator 20 contains a gate insulating film 22 formed under the charge holding region 21, a lateral oxide film 23 formed by oxidizing the lateral of the charge holding region 21, and an upper insulating film 24 formed above the charge holding region 21. Each region of the insulator 20 surrounding the charge holding region 21 does not need to contain the same material and also does not need to be a simultaneously formed insulator. A sidewall 25 is formed around the gate insulating film 22 and the lateral oxide film 23.

The content by percentage of the halogen in the insulator 20 may be 0.01 (atm %) or more in at least the partial region in contact with the charge holding region 21. The content by percentage of the halogen in the insulator 20 may be 0.05 (atm %) or more in at least the partial region in contact with the charge holding region 21. The content by percentage of the halogen in the insulator 20 may be 0.1 (atm %) or more in at least the partial region in contact with the charge holding region 21.

In the gate insulation film 22, a tunnel insulation film 221 is formed. The tunnel insulation film 221 is a portion which is formed to have a relatively thin film thickness in the gate insulation film 22. A region of the charge holding region 21 where the tunnel insulation film 221 is formed serves as a charge inlet 211 injecting charges into the charge holding region 21 or releasing charges from the charge holding region 21. More specifically, the charge holding region 21 has the charge inlet 211 for injecting charges or releasing charges.

The control gate region CG has a polysilicon film 31 formed on the upper insulation film 24. Around the polysilicon film 31, a sidewall 32 formed on the upper insulation film 24 is formed.

The drain region D has an N-type region 11 and an N-type N+ region 12 having an impurity concentration higher than that of the N-type region 11. The N+ region 12 is provided in order to obtain an ohmic contact of the drain region D and a plug 52 described later.

The source region S has an N-type region 13 and an N-type N+ region 14 having an impurity concentration higher than that of the N-type region 13. The N+ region 14 is provided in order to obtain an ohmic contact of the source region S and a plug 53 described later. The drain region D and the source region S are defined by a direction where a current flows. Therefore, when the direction where a current flows is reversed to a current assumed in the nonvolatile storage element M illustrated in FIG. 1, the drain region D illustrated in FIG. 1 serves as the source region S and the source region S serves as the drain region D.

The nonvolatile storage element M is provided with a protective film 61 formed on the control gate region CG, the floating gate region FG, the drain region D, and the source region S. In the protective film 61, an opening portion exposing a part of the polysilicon film 31 of the control gate region CG as the bottom surface is formed. In the opening portion, a plug 51 is formed to be embedded. Thus, the plug 51 and the polysilicon film 31 of the control gate region CG are electrically connected.

In the protective film 61, an opening portion exposing a part of the N+ region 12 of the drain region D as the bottom surface is formed. In the opening portion, a plug 52 is embedded. Thus, the plug 52 and the N+ region 12 are electrically connected. Moreover, in the protective film 61, an opening portion exposing a part of the N+ region 14 of the source region S as the bottom surface is formed. In the opening portion, a plug 53 is embedded. Thus, the plug 53 and the N+ region 14 are electrically connected.

Although not illustrated, a wiring line formed on the protective film 61 is connected to each of the plugs 51, 52, and 53. A voltage of a predetermined level is applied to the control gate region CG, the drain region D, and the source region S of the nonvolatile storage element M from the wiring line.

Figure 2A:
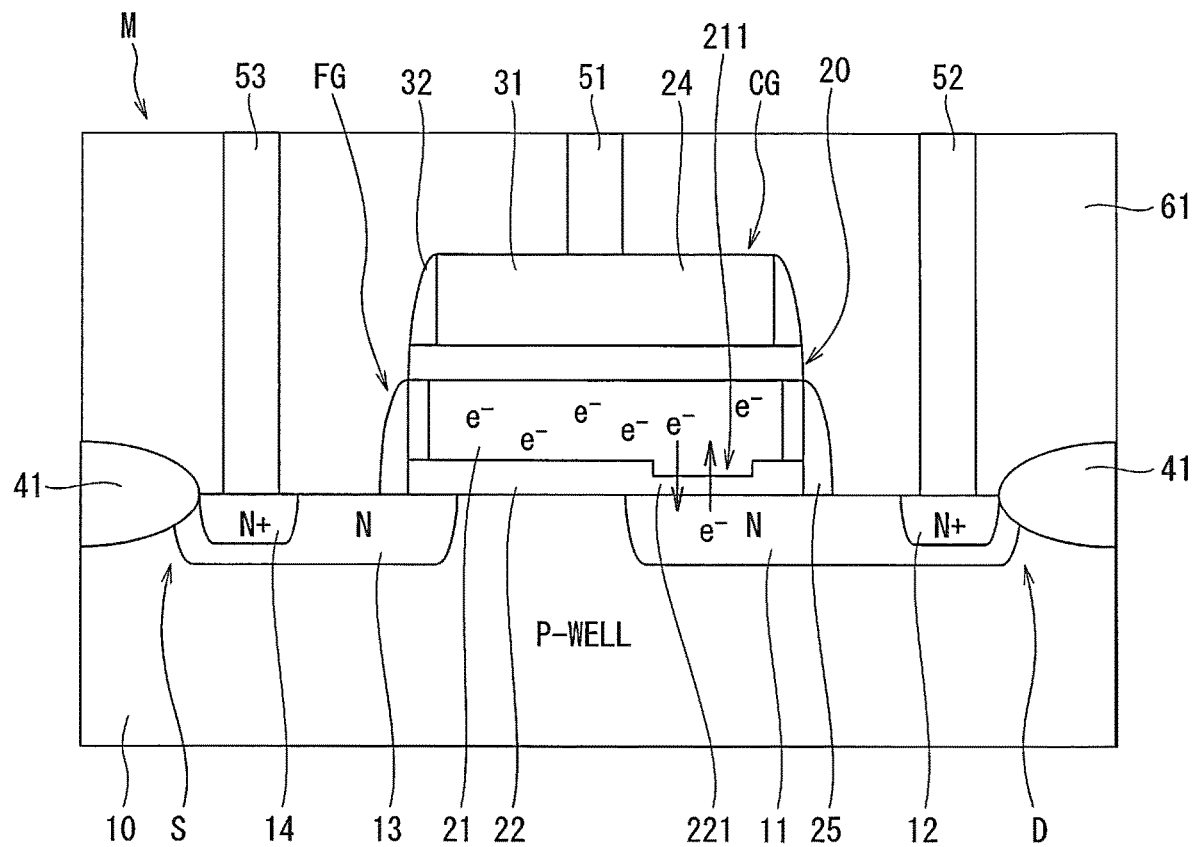
FIGS. 2A to 2C are views for explaining states of charge injection and charge emission of the nonvolatile storage element M according to the first embodiment of the present invention.
Figure 2B:
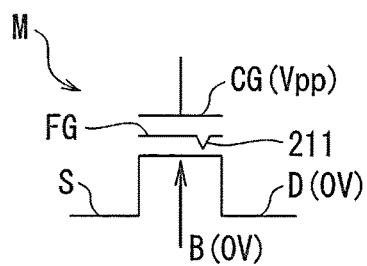
Figure 2C:
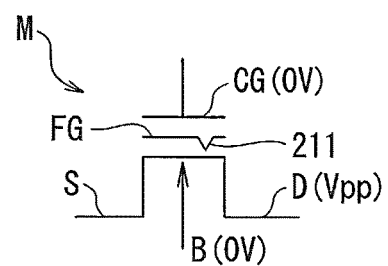

A threshold voltage Vth of the nonvolatile storage element M is controlled by the amount of charges injected into the floating gate region FG. As illustrated in FIG. 2A, electrons as the charge are injected into the floating gate region FG of the nonvolatile storage element M through the charge inlet 211. In FIG. 2A, in order to facilitate the understanding, the illustration of hatching to the cross section of each constituent component of the nonvolatile storage element M is omitted. As illustrated in FIG. 2B, when the electrons are injected into the floating gate region FG, the P-well region 10 (i.e., back gate B) and the drain region D are fixed to 0 V (0 V is applied), and then a pulse voltage Vpp of 10 V or more is applied to the control gate region CG, for example. Thus, as indicated by the upward straight arrow in FIG. 2A, the electrons are injected into the charge holding region 21 from the drain region D through the charge inlet 211. On the other hand, as illustrated in FIG. 2C, when the electrons are released from the floating gate region FG, the control gate region CG and the P-well region 10 (i.e., back gate B) are fixed to 0 V (0 V is applied), and then a pulse voltage Vpp of 10 V or more is applied to the drain region D, for example. Thus, as indicated by the downward straight arrow in FIG. 2A, the electrons are released from the charge holding region 21 to the drain region D through the charge inlet 211. Thus, the nonvolatile storage element M can put in/put out the charges through the charge inlet 211 by controlling the voltage to be applied to the control gate region CG, the P-well region 10, and the drain region D. Since the nonvolatile storage element M does not use the source region S for putting in/putting out the charges, the source region S may be fixed to a predetermined voltage (for example, 0 V) or may be set to a floating state. Again, the drain region D and the source region S are defined by the current flowing direction. Therefore, when a direction of passing a current is reversed to a direction of passing a current assumed in the nonvolatile storage element M illustrated in FIG. 2A, the drain region D illustrated in FIG. 2A serves as the source region S and the source region S serves as the drain region D.

Next, a method for manufacturing the nonvolatile storage element M is described using FIGS. 1 and 3 to 11. FIGS. 1 and 3 to 11 (except FIG. 8B) illustrate only the nonvolatile storage element M to be used as a depletion type transistor. However, when a reference voltage generation circuit (details of which are described later) is formed using the nonvolatile storage element M according to this embodiment, the nonvolatile storage element to be used as an enhancement type transistor and the nonvolatile storage element to be used as a depletion type transistor are simultaneously processed to have the same structure under the same conditions.

Figure 3:
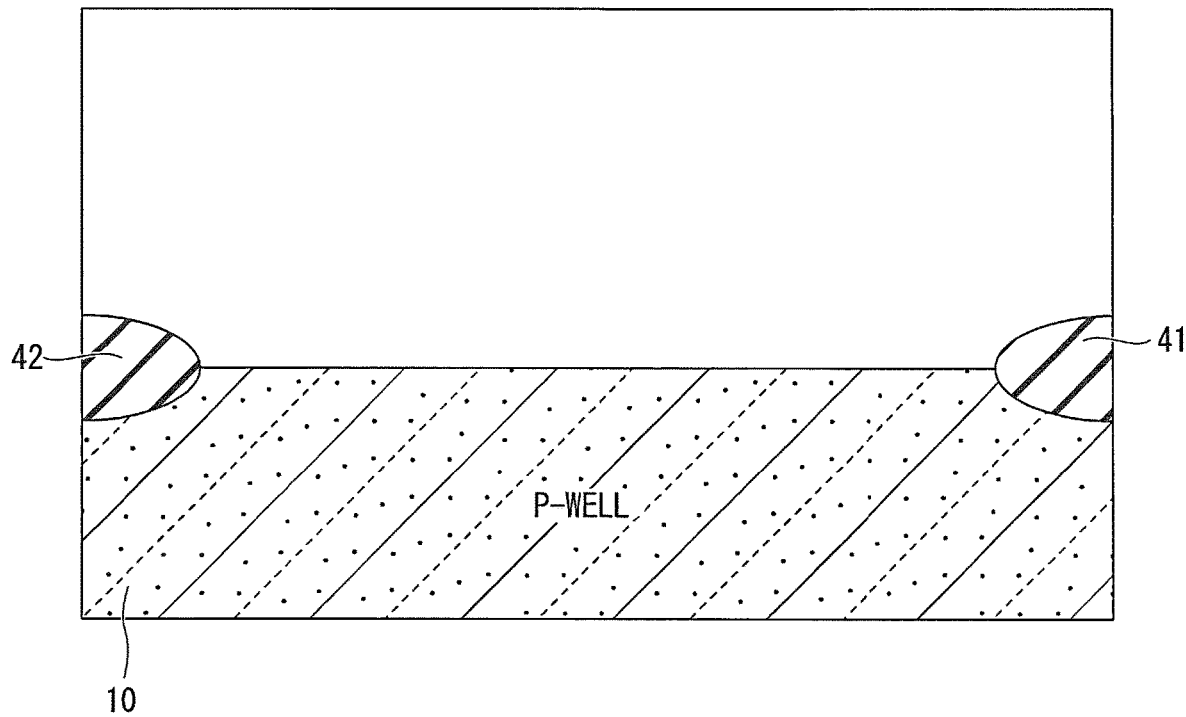
FIG. 3 is a cross-sectional view of a manufacturing process (No. 1) of the nonvolatile storage element M according to the first embodiment of the present invention.

As illustrated in FIG. 3, the element isolation regions (LOCOS) 41, 42 and the P-well region 10 are formed in an upper portion of a semiconductor substrate (A silicon substrate is taken as an example in this embodiment.).

Figure 4:
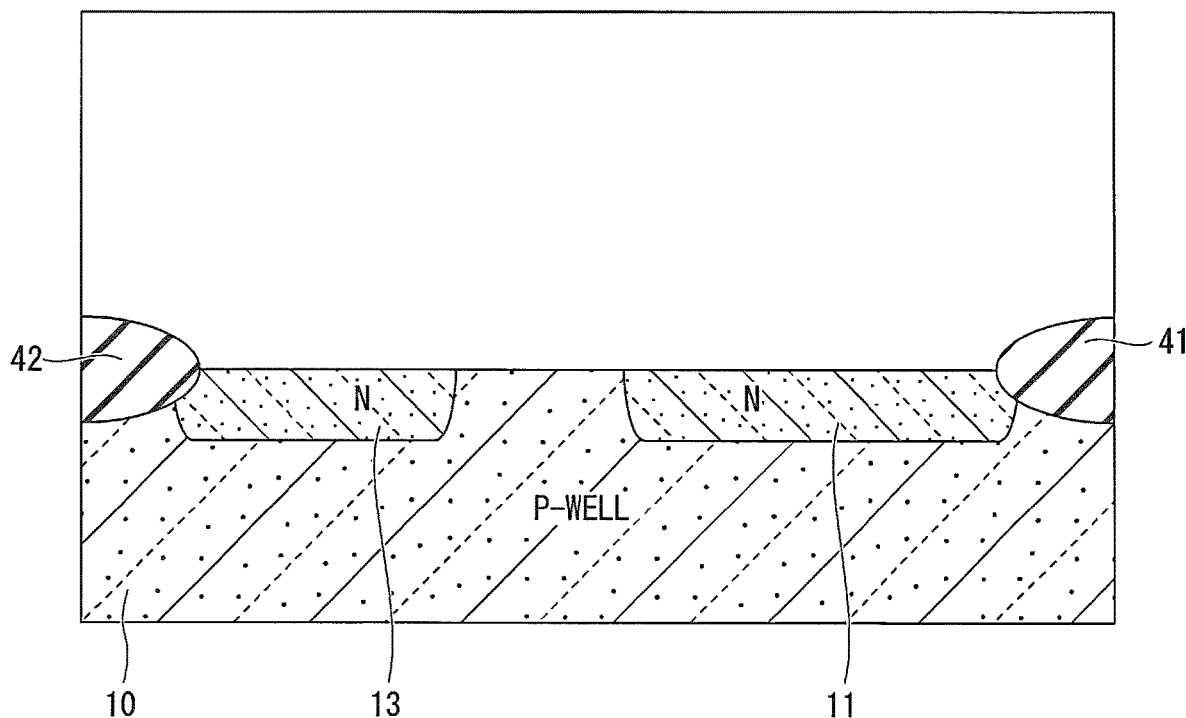
FIG. 4 is a cross-sectional view of the manufacturing process (No. 2) of the nonvolatile storage element M according to the first embodiment of the present invention.

Next, as illustrated in FIG. 4, using a photolithographic technology and an ion implantation method, the N-type region 13 is formed in a place where the source region S is formed in an upper portion of the P-well region 10 disposed between the element isolation region 41 and the element isolation region 42, and the N-type region 11 is formed in a place where the drain region D is formed.

Figure 5:
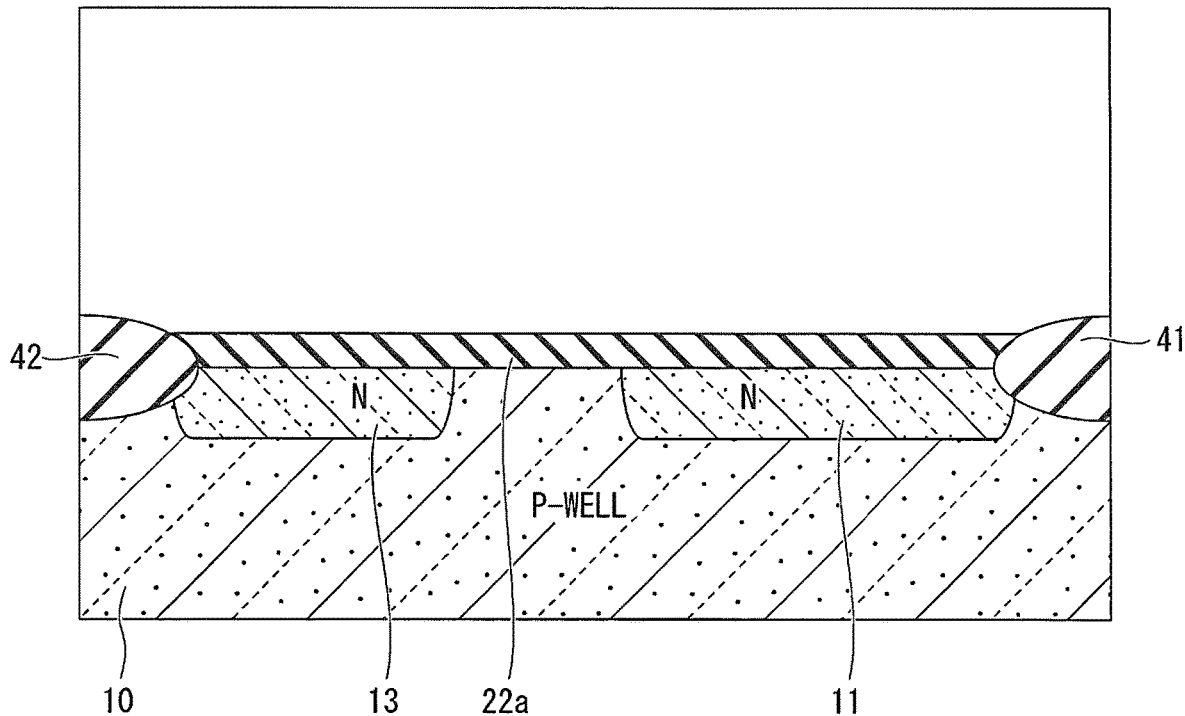
FIG. 5 is a cross-sectional view of the manufacturing process (No. 3) of the nonvolatile storage element M according to the first embodiment of the present invention.

Next, as illustrated in FIG. 5, an insulating film 22a which is finally formed into a gate insulating film 22 is formed on the surface of the silicon substrate.

Figure 6:
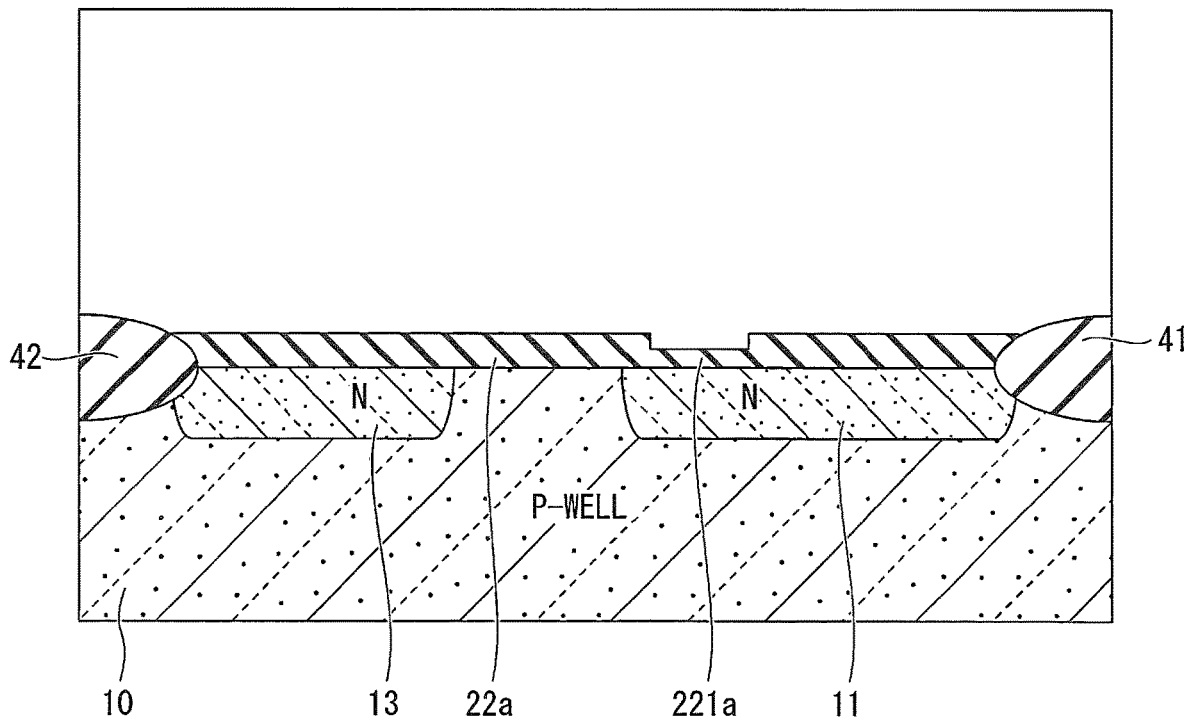
FIG. 6 is a cross-sectional view of the manufacturing process (No. 4) of the nonvolatile storage element M according to the first embodiment of the present invention.

Next, as illustrated in FIG. 6, a part of the insulating film 22a in a place where the charge inlet 211 into the floating gate region FG (see FIG. 1) is provided is removed by a photolithographic technology and a wet etching technology to form a thin film region 221a having a thickness (for example, 100 Å) such that charge injection can be performed.

Figure 7:
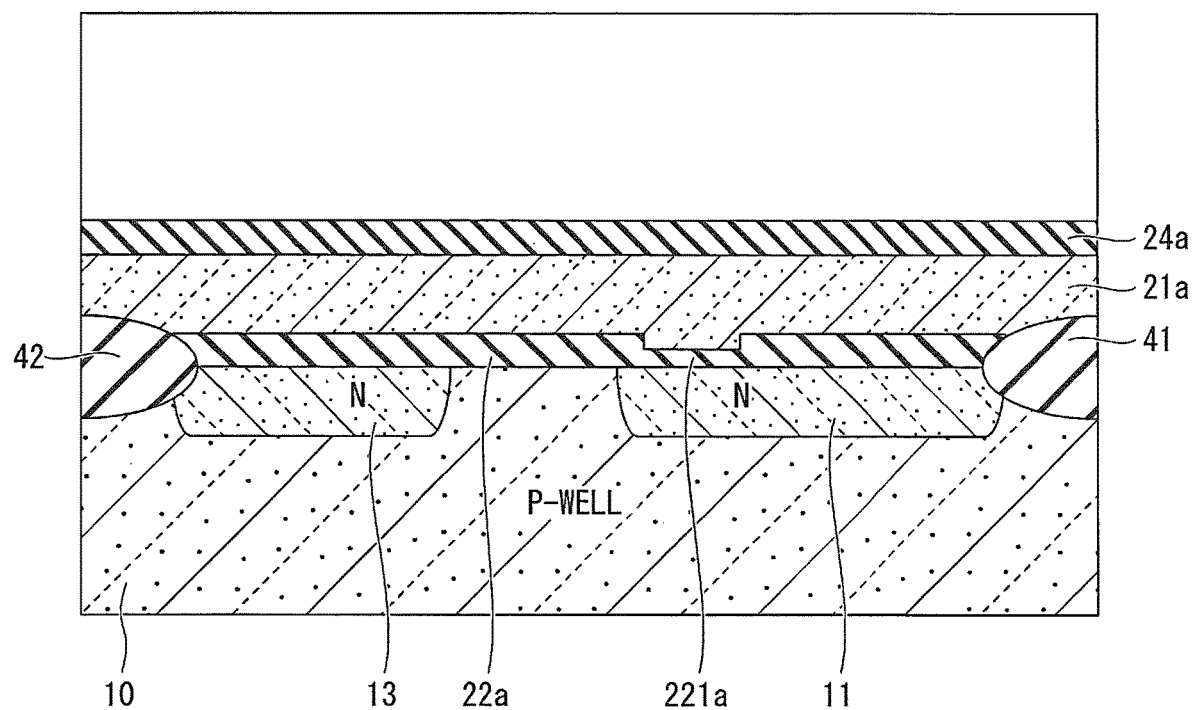
FIG. 7 is a cross-sectional view of the manufacturing process (No. 5) of the nonvolatile storage element M according to the first embodiment of the present invention.

Next, as illustrated in FIG. 7, a polysilicon film 21a doped with phosphorus which is finally formed into the charge holding region 21 of the floating gate region FG is formed. Furthermore, an oxide/nitride/oxide (ONO) film 24a which is finally formed into the upper insulating film 24 is formed on the upper layer of the polysilicon film 21a. Although the ONO film 24a contains a combination of a silicon oxide film and a silicon nitride film, the ONO film 24a may contain only a pure silicon oxide film or silicon nitride film.

Figure 8A:
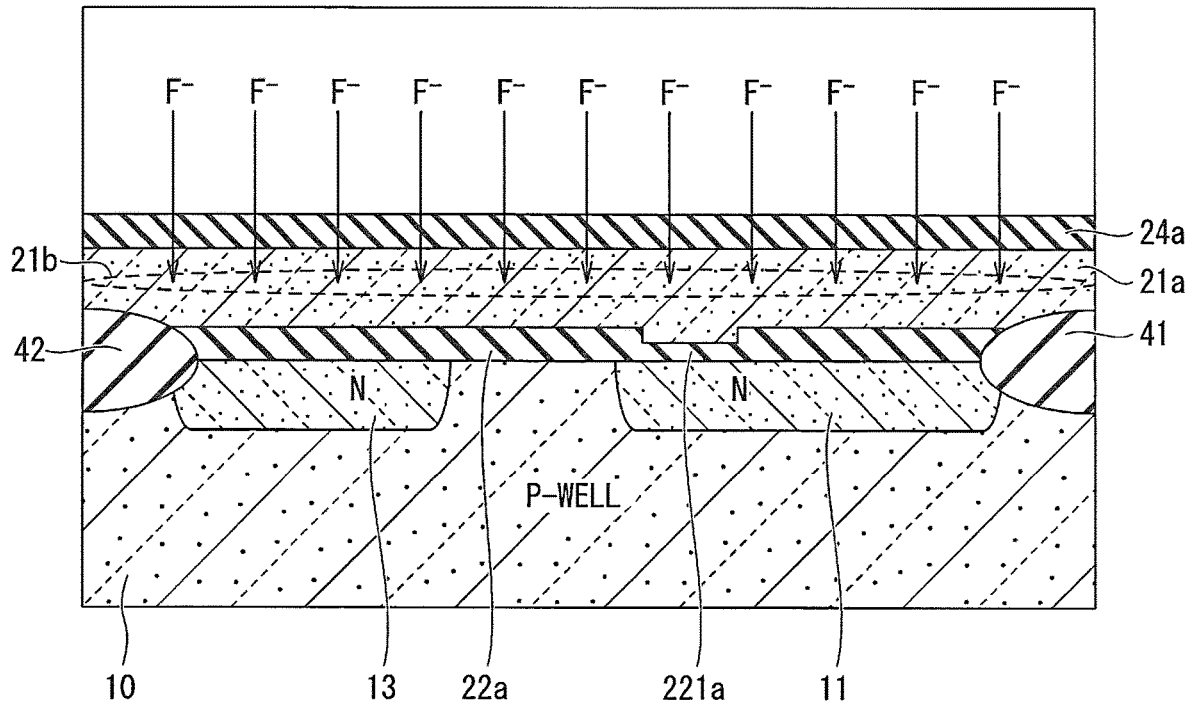
Figure 8B:
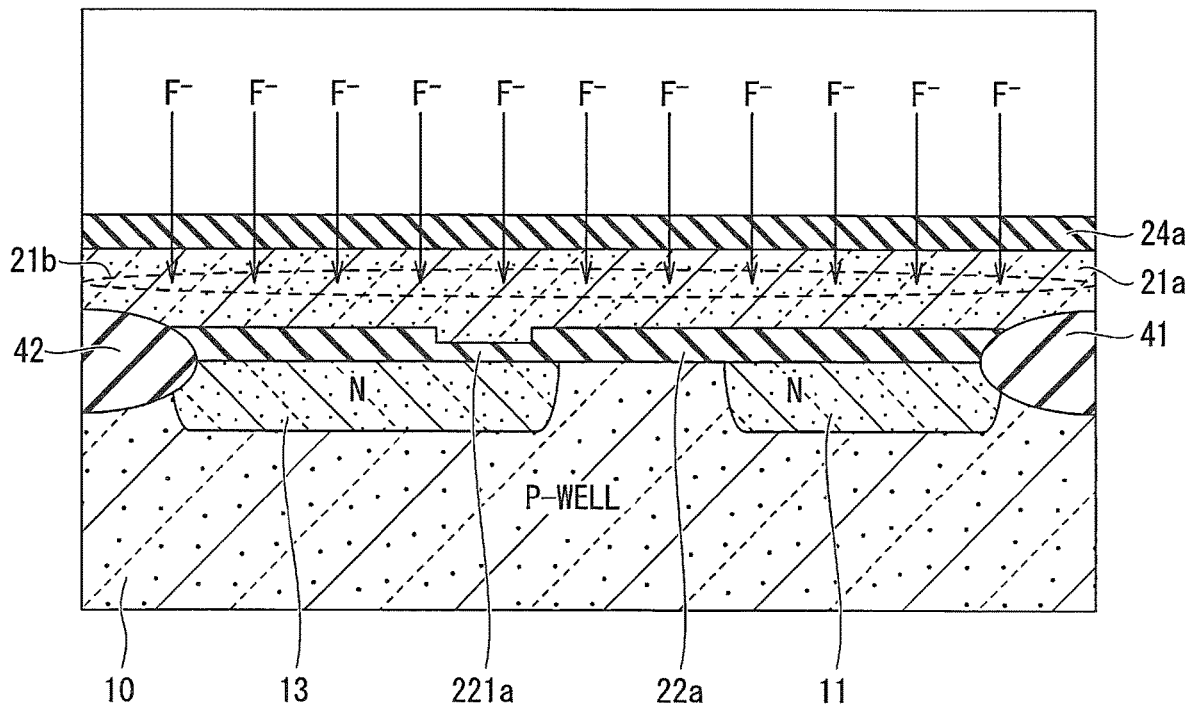

Next, as illustrated in FIGS. 8A and 8B, fluorine ions are injected into the polysilicon film 21a with a dose amount of $1\times10^{15}$ cm$^{-2}$ at an acceleration energy of 30 keV, for example. Thus, a fluorine existing region 21b where a relatively large amount of fluorine is present is formed in the polysilicon film 21a. When the nonvolatile storage element M is used for a reference voltage generation circuit, the same amount of fluorine is injected into the polysilicon film 21a in the nonvolatile storage element (see FIG. 8A) to be finally used as a depletion type transistor and the nonvolatile storage element (see FIG. 8B) to be finally used as an enhancement type transistor. As illustrated in FIG. 8A, in the nonvolatile storage element to be finally used as a depletion type transistor, the thin film region 221a is formed on the N-type region 11 configuring the drain region D. On the other hand, as illustrated in FIG. 8B, in the nonvolatile storage element to be finally used as an enhancement type transistor, the thin film region 221a is formed on the N-type region 13 configuring the source region S.

Figure 9:
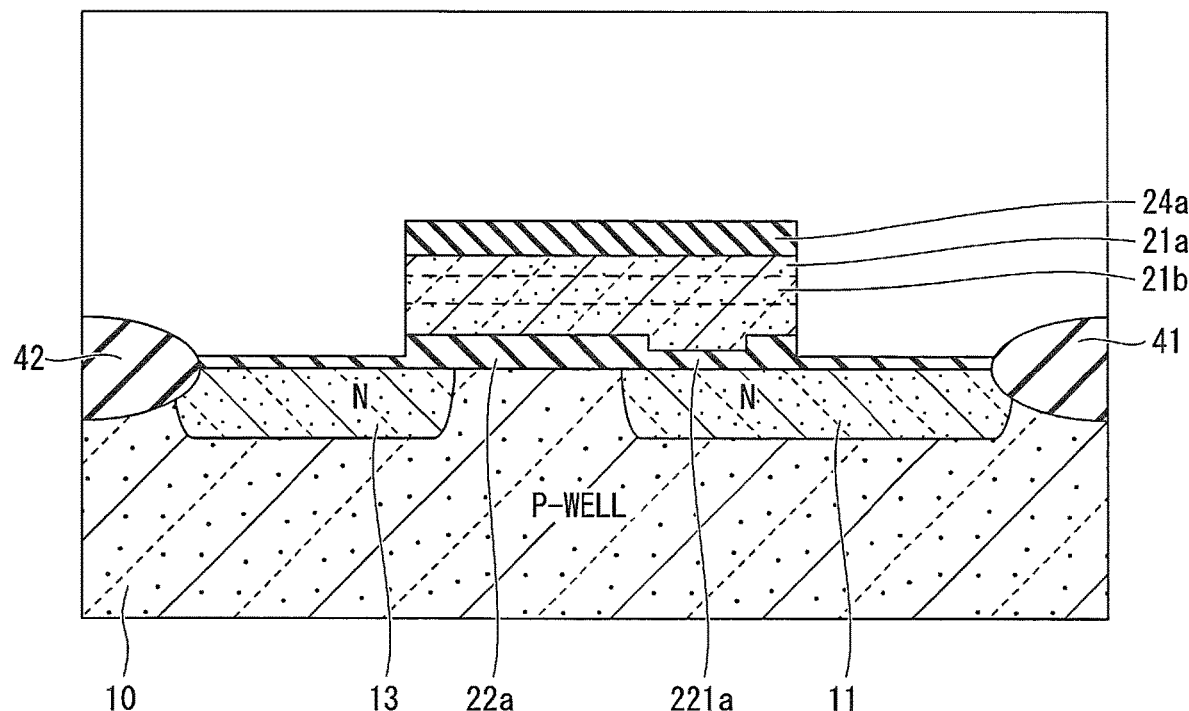
FIG. 9 is a cross-sectional view of the manufacturing process (No. 7) of the nonvolatile storage element M according to the first embodiment of the present invention.

Next, as illustrated in FIG. 9, a part of the insulating film 22a, the polysilicon film 21a, and the ONO film 24a are processed into the dimension according to a circuit application using a photolithographic technology and an etching technology. At this time, the polysilicon film 21a and the ONO film 24a are etched so that the thin film region 221a is included under the polysilicon film 21a and the ONO film 24a after the processing.

Figure 10:
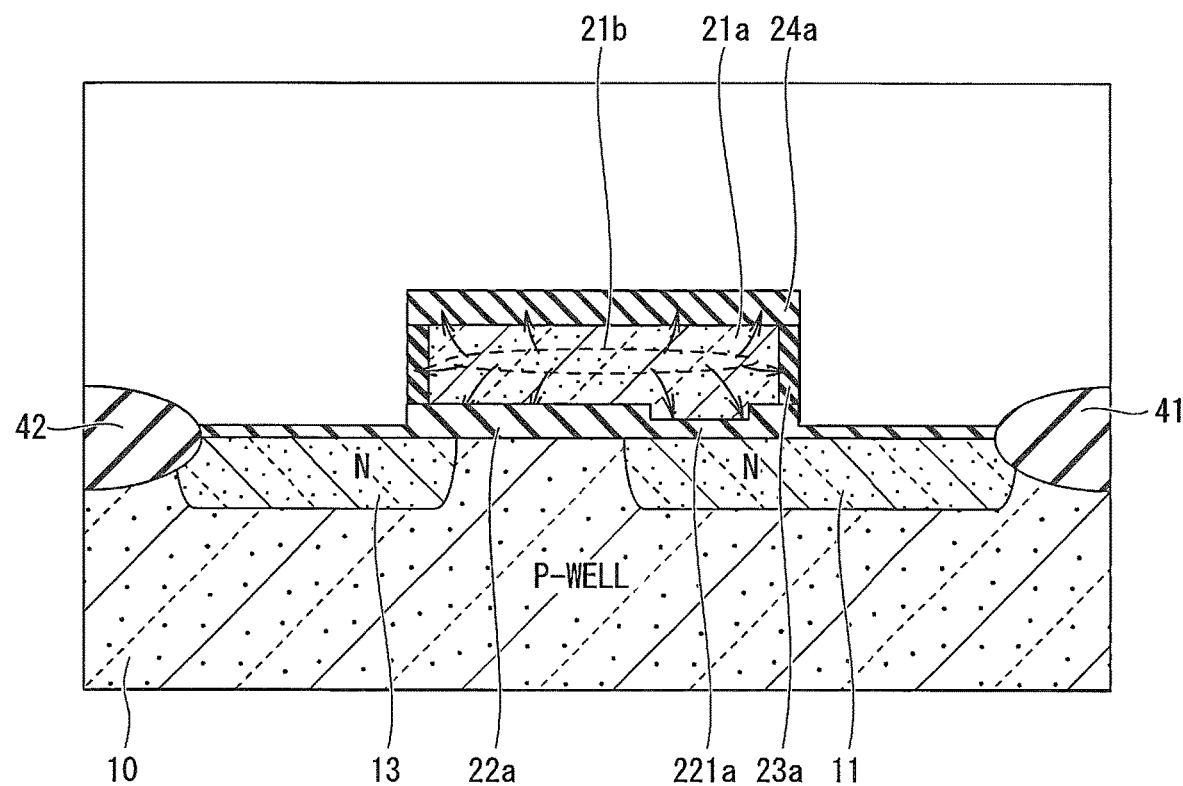
FIG. 10 is a cross-sectional view of the manufacturing process (No. 8) of the nonvolatile storage element M according to the first embodiment of the present invention.

Next, as illustrated in FIG. 10, oxidation (for example, wet oxidation at 850° C.) is carried out to oxidize the lateral of the polysilicon film 21a to form the oxide film 23a and the fluorine injected into the polysilicon film 21a is segregated in the insulating film 22a, the thin film region 221a, the ONO film 24a, and the oxide film 23a surrounding the polysilicon film 21a. Since the segregation coefficient of a silicon/silicon oxide film interface is about $5.6 \times 10^{-8}$, the fluorine is rapidly taken into the silicon oxide film when heating is performed and can be segregated in the silicon oxide film. More specifically, as indicated by curved arrows illustrated in FIG. 10, the fluorine can be distributed at a high concentration from the fluorine existing region 21b in all directions surrounding the polysilicon film 21a which is formed into the charge holding region 21 by the oxidation.

Figure 11:
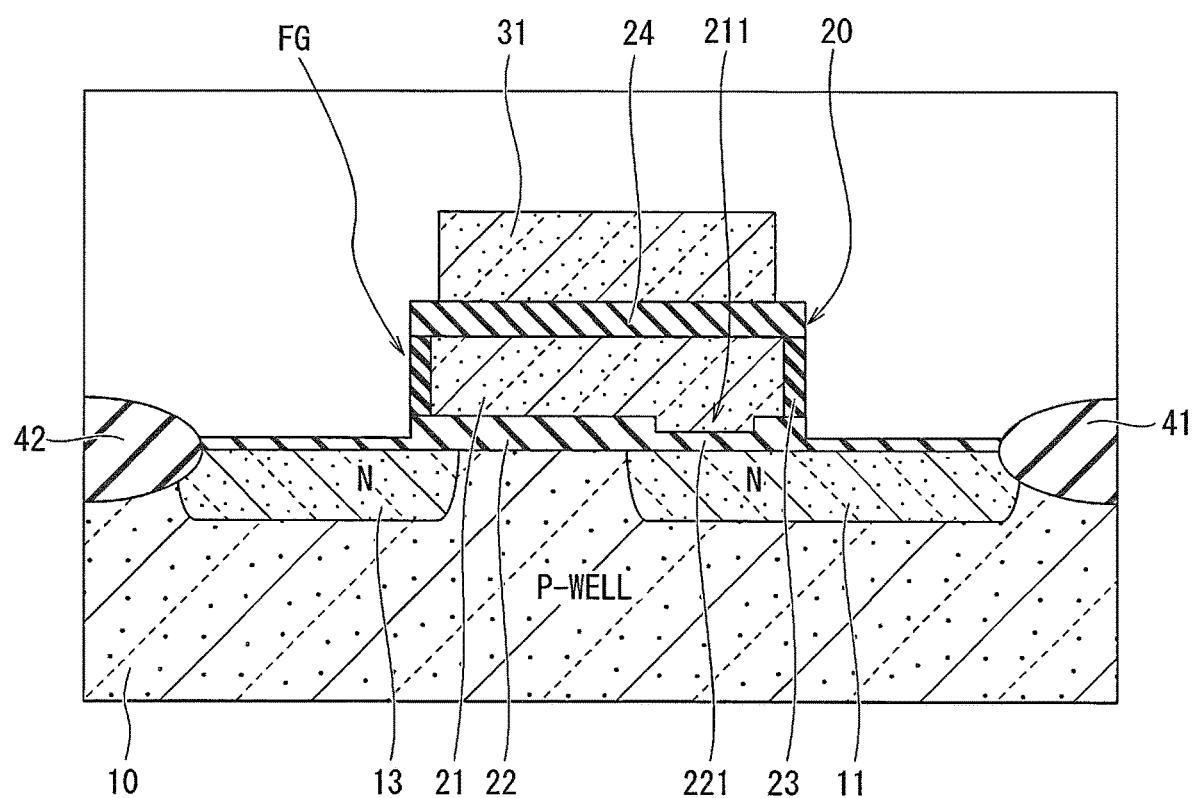
FIG. 11 is a cross-sectional view of the manufacturing process (No. 9) of the nonvolatile storage element M according to the first embodiment of the present invention.

By the etching into a predetermined shape and the segregation of the fluorine, the polysilicon film 21a is formed into the charge holding region 21, the insulating film 22a is formed into the gate insulating film 22, the thin film region 221a is formed into the tunnel insulating film 221, the oxide film 23a is formed into the lateral oxide film 23, and the ONO film 24a is formed into the upper insulating film 24 as illustrated in FIG. 11. Thus, the floating gate region FG having the charge holding region 21 surrounded by the insulator 20 and provided with the charge inlet 211 is formed.

Next, a polysilicon film is deposited on the entire surface of the silicon substrate, phosphorus is doped, and then the polysilicon film 31 is formed on the floating gate region FG using a photolithographic technology and an etching technology. Thus, the control gate region CG disposed in contact with a part of the upper insulating film 24 is formed.

Figure 1:
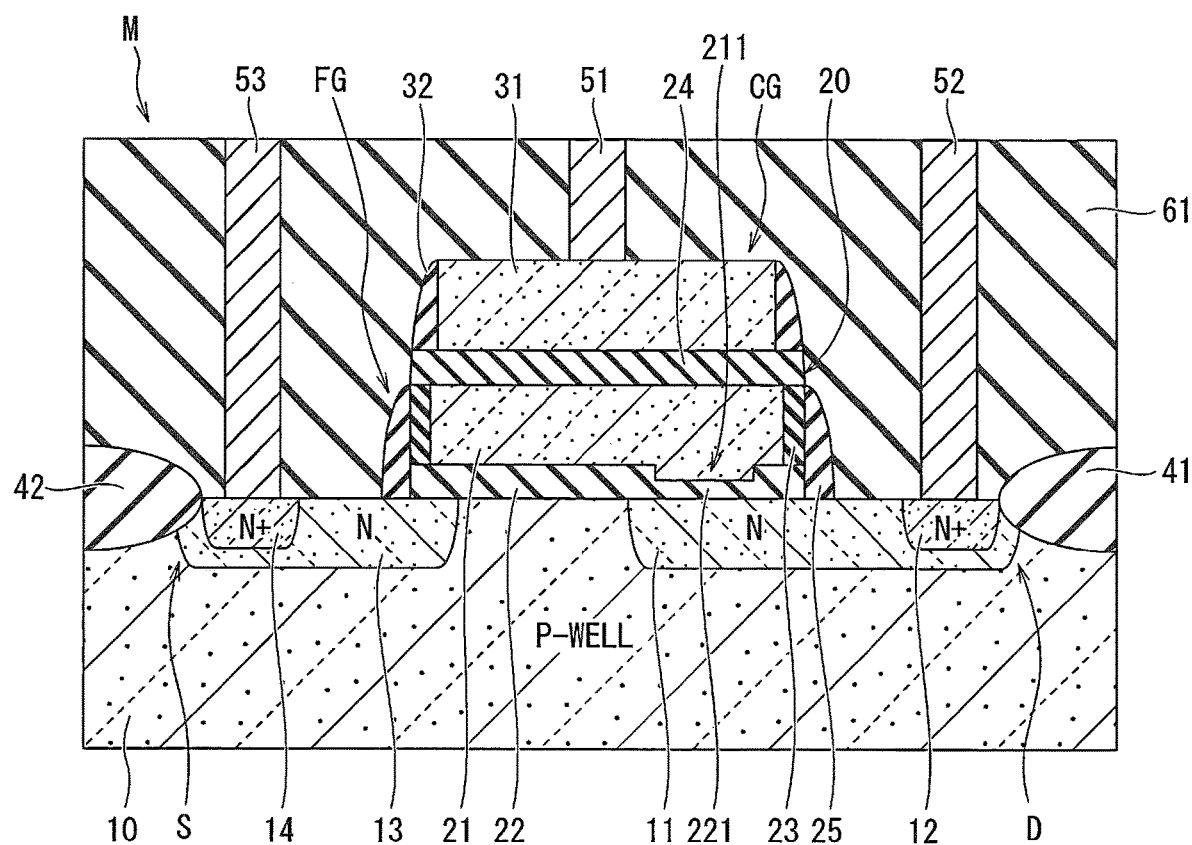
FIG. 1 is a cross-sectional view illustrating the schematic configuration of a nonvolatile storage element M according to a first embodiment of the present invention.

Next, after the insulating film 22a on the N-type region 11 and the N-type region 13 is removed, the sidewall 25 of an insulating film is formed in a side portion of each of the lateral oxide film 23 and the gate insulating film 22 and the sidewall 32 of an insulating film is formed in a side portion of the polysilicon film 31 as illustrated in FIG. 1.

Next, as illustrated in FIG. 1, the high-concentration N+ region 12 for obtaining an ohmic contact with metal is formed in a contact portion of the N-type region 11 and the high-concentration N+ region 14 for obtaining an ohmic contact with metal is formed in a contact portion of the N-type region 13. Thus, the drain region D is formed in one of both sides of a lower portion of the control gate region CG and the floating gate region FG and the source region S is formed in the other one of both the sides.

Next, as illustrated in FIG. 1, the insulating protective film 61 is formed on the entire surface of the silicon substrate.

The protective film 61 is formed to cover the control gate region CG and the floating gate region FG and the drain region D and the source region S.

Next, opening portions exposing a part of the polysilicon film 31, the N+ region 12, and the N+ region 14 as the bottom surface are formed in the protective film 61 using a photographic technology and an etching technology. Subsequently, as illustrated in FIG. 1, a metal plug 51 is formed in the opening portion exposing a part of the polysilicon film 31, a metal plug 52 is formed in the opening portion exposing a part of the N+ region 12 to the bottom surface, and a metal plug 53 is formed in the opening portion exposing a part of the N+ region 14 to the bottom surface using a thin film formation technology.

Although not illustrated, a wiring line electrically connected to the plugs 51, 52, and 53 is next formed through a common wiring line formation process. Through the processes above, the nonvolatile storage element M in which fluorine is distributed in all directions of the insulator 20 surrounding the charge holding region 21 is completed as illustrated in FIG. 1. In contact portions of the control gate region CG, the source region S, and the drain region D, a silicide may be formed in order to lower the contact resistance. The content by percentage of the fluorine in the insulator 20 is optimally 0.1 to 1 atm % (In the case of $SiO_2$, the concentration is about $1 \times 10^{20}$ cm$^{-3}$). When the content by percentage of the fluorine in the insulator 20 is excessively large, the charge holding characteristics of the nonvolatile storage element M degrade.

Figure 12:
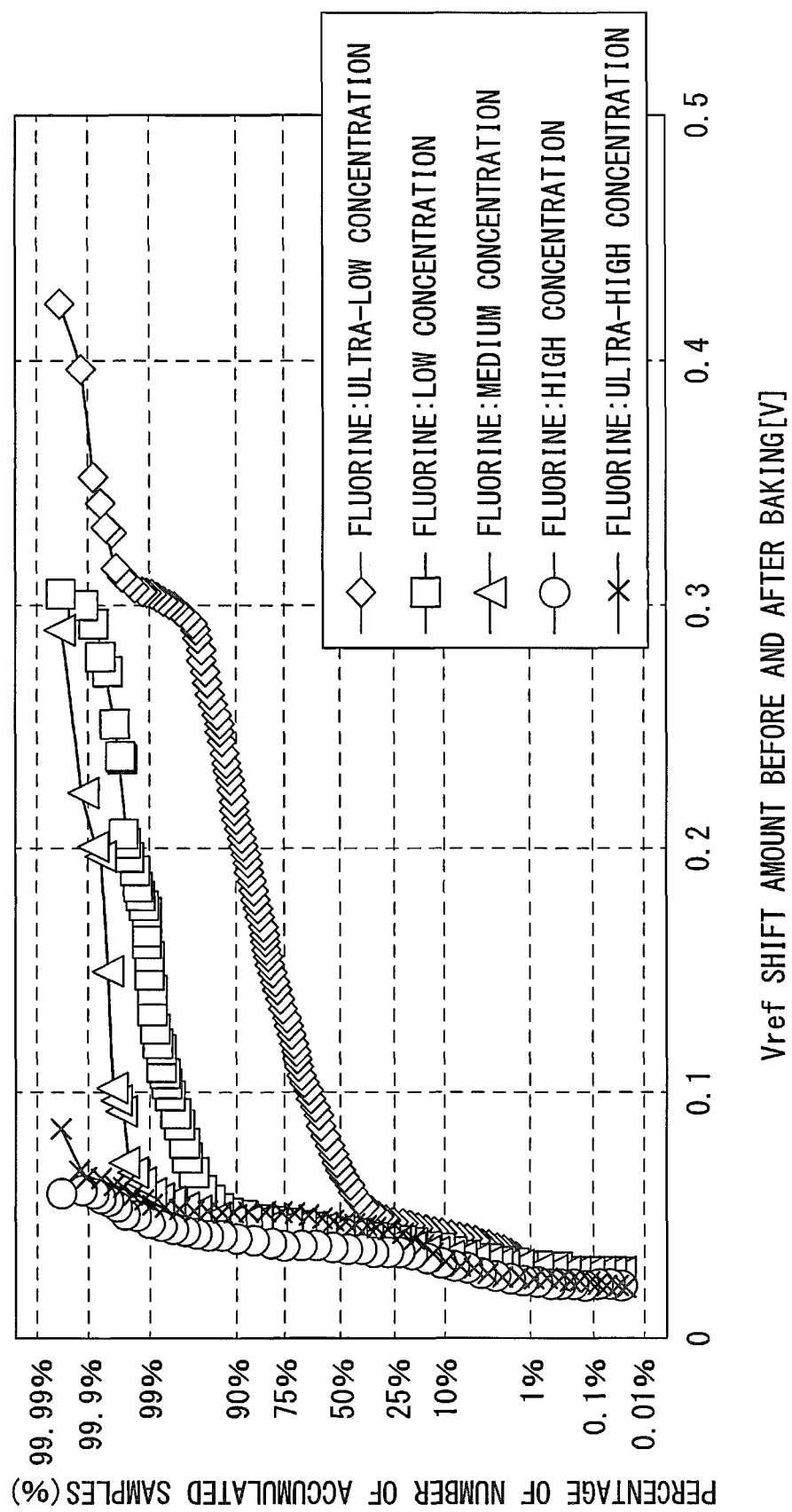
FIG. 12 is a graph illustrating statistical evaluation results for explaining charge holding characteristics of a reference voltage generation circuit 1 using the nonvolatile storage element M according to the first embodiment of the present invention.

Next, the charge holding characteristics of the nonvolatile storage element M are described using FIG. 12 referring to FIG. 1. In the nonvolatile storage element M, halogen is distributed in the insulator 20 surrounding the charge holding region 21. The halogen has effects of terminating a dangling bond present in the insulator 20 or in the interface between the insulator 20 and another material, relaxing a strain in the insulator 20, and a gettering effect of movable ions and can reduce defects resulting from the dangling bond, the strain, and the movable ions. More specifically, the halogen distributed in the insulator 20 has an effect of suppressing a charge leakage through the defects in the insulator 20. As a result, the nonvolatile storage element M has excellent charge holding characteristics while having flexibility for the layout dimension. An analog circuit, such as a reference voltage generation circuit, configured by the nonvolatile storage element M can realize stable electric characteristics.

Herein, characteristics demanded for the charge holding characteristics of nonvolatile storage elements are described. In the case of a nonvolatile storage element to be used for a nonvolatile memory, the threshold voltage Vth of the nonvolatile storage element may determine 0 and 1. Between the threshold voltage Vth of the nonvolatile storage element exhibiting 0 or 1 and a threshold value judgement voltage, there is usually a margin of about several V. Therefore, even when the charge holding characteristics of the nonvolatile storage element are somewhat poor, so that a threshold voltage shift of about zero point several volts occurs, the shift does not lead to a defect in many cases. However, when the nonvolatile storage element is used for an analog circuit, e.g., in a circuit requiring a highly accurate reference voltage Vref, even the occurrence of a threshold voltage shift of 0.1 V immediately leads to a defect. Therefore, when aiming at the use of the nonvolatile storage element in an analog manner, e.g., reference voltage generation circuit, a nonvolatile storage element which has excellent charge holding characteristics such that a threshold shift of less than 0.1 V can be realized while having the flexibility for the layout dimension is required.

Next, a region where the halogen is introduced is described. It is minimally required that the halogen is introduced into a main path where charges are discharged from the charge holding region 21. It is preferable that the region is introduced in all directions surrounding the charge holding region 21. While there are various reasons thereof, the following reasons (1) to (3) are mentioned as main reasons.

(1) Since the nonvolatile storage element according to this embodiment is used in a circuit in which analog characteristics are regarded as important, the nonvolatile storage element according to this embodiment is more strict to a characteristic shift as compared with a nonvolatile storage element for use in a conventional nonvolatile memory.

(2) Since the layout dimension of the element varies in each intended use in an analog circuit and a very large size is used in some cases, the main path (main surface) of a charge leakage varies according to the layout dimension.

(3) Since the nonvolatile storage element according to this embodiment does not have a specified array structure as with a conventional nonvolatile memory, the environment around the nonvolatile storage element is not the same and the main path (main surface) of a charge leakage varies according to the surrounding environment.

FIG. 12 illustrates a graph statistically expressing the charge holding characteristics of the reference voltage generation circuits (details of which are described later) with 2000 or more points for each explanatory legend, using a cumulative frequency distribution, when fluorine was distributed in all directions of the insulator 20 surrounding the charge holding region 21 of the nonvolatile storage element M. The horizontal axis of the graph illustrated in FIG. 12 represents a shift amount (V) of the reference voltage Vref output by the reference voltage generation circuit before and after baking. The vertical axis represents the percentage of the number of accumulated samples (%). The baking condition is 10 hours at 250° C. A curve connecting ◇ marks in FIG. 12 represents the characteristics when the fluorine injection amount is the smallest dose amount: $1\times10^{13}$ cm$^{-2}$ or less (Fluorine: Ultra-low concentration). A curve connecting □ marks represents the characteristics when the fluorine dose amount is the second smallest dose amount $5\times10^{13}$ cm$^{-2}$ (Fluorine: low concentration). A curve connecting △ marks in FIG. 12 represents the characteristics when the fluorine dose amount is the third smallest dose amount $1\times10^{14}$ cm$^{-2}$ (Fluorine: Medium concentration). A curve connecting ○ marks represents the characteristics when the fluorine dose amount is the fourth smallest dose amount $5\times10^{14}$ cm$^{-2}$ (Fluorine: High concentration). A curve connecting x marks represents the characteristics when the fluorine dose amount is the largest dose amount $5\times10^{15}$ cm$^{-2}$ (Fluorine: Ultra-high concentration).

The charge holding characteristics when the common nonvolatile storage elements disclosed in PTLs 2 and 3 are used in an analog manner as a constituent element of a reference voltage generation circuit exhibits the same tendency as that in the case of "Fluorine: Ultra-low concentration". In the reference voltage generation circuit using the nonvolatile storage element of "Fluorine: Ultra-low concentration", the charge holding characteristics are somewhat poor, and therefore a ratio of a somewhat bad abnormal value is high. The "somewhat bad abnormal value" taken herein is found in statistical evaluation and is not intrinsic degradation found in common evaluation of charge holding characteristic. Therefore, verifications of detection and effects are difficult, and thus the statistical evaluation illustrated in FIG. 12 is required. The somewhat bad abnormal value of a shift of zero point several volts does not pose a problem in the range where the nonvolatile storage element is used as a common nonvolatile memory as described above and poses a problem when used as an element configuring an analog circuit.

It is found that the somewhat bad abnormal value of a shift of zero point several volts decreases in accordance with the injection amount of the fluorine injected into the insulator 20 as illustrated in FIG. 12. The fluorine injected into the insulator 20 effectively acts on the nonvolatile storage element M having somewhat poor charge holding characteristics to improve the charge holding characteristics by selecting a proper concentration. Meanwhile, the fluorine injected into the insulator 20 does not produce a great change in the charge holding characteristics in the nonvolatile storage element M originally exhibiting good charge holding characteristics. However, when the fluorine is excessively injected into the insulator 20 as illustrated in "Fluorine: Ultra-high concentration" in FIG. 12, the charge holding characteristics degrade as compared with a case of the optimal fluorine injection amount, such as "Fluorine: High concentration".

Figure 13A:
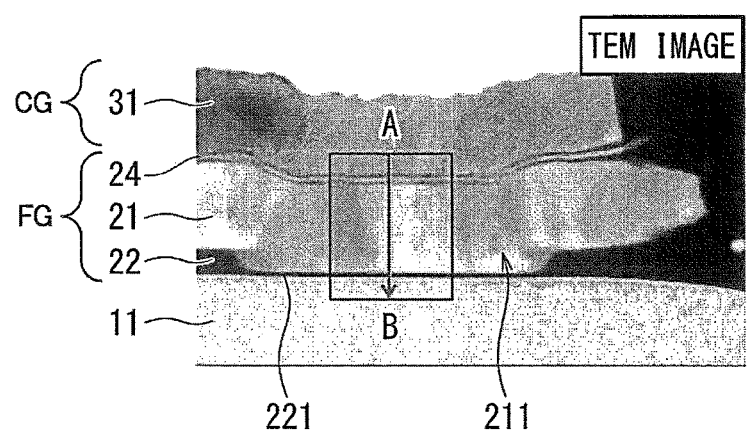
FIGS. 13A to 13C are views illustrating analysis results of fluorine distribution of the nonvolatile storage element M according to the first embodiment of the present invention.
Figure 13B:
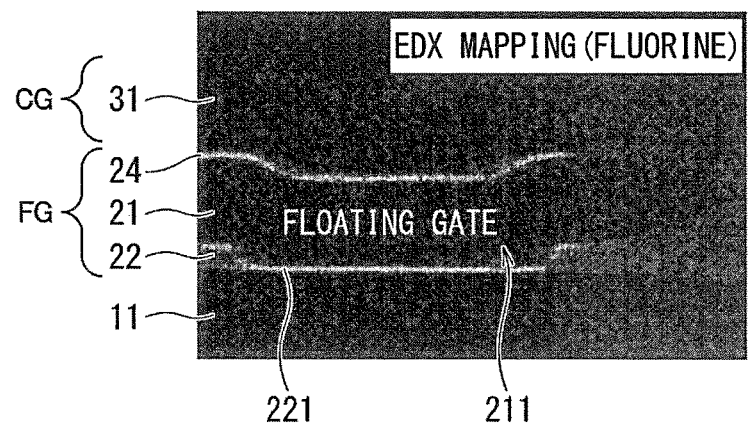

FIG. 13A is an image in which the cross section of the nonvolatile storage element M in the vicinity of the charge inlet 211 is imaged with a transmission electron microscope (TEM). FIG. 13B illustrates energy dispersive X-ray spectrometry (EDX) mapping of the fluorine used as the halogen in the same place as that of FIG. 13A.

As illustrated in FIG. 13A, the tunnel insulating film 221 having a relatively thin film thickness of the gate insulating film 22 is present between the charge holding region 21 and the drain region D. Between the charge holding region 21 and the polysilicon film 31, the upper insulating film 24 is present. As illustrated in FIG. 13B, images of the tunnel insulating film 221 and the upper insulating film 24 are white images unlike the charge holding region 21 or the polysilicon film 31. Thus, it is found that a large amount of fluorine is contained in the tunnel insulating film 221 and the upper insulating film 24 as compared with the charge holding region 21 or the polysilicon film 31.

Figure 13C:
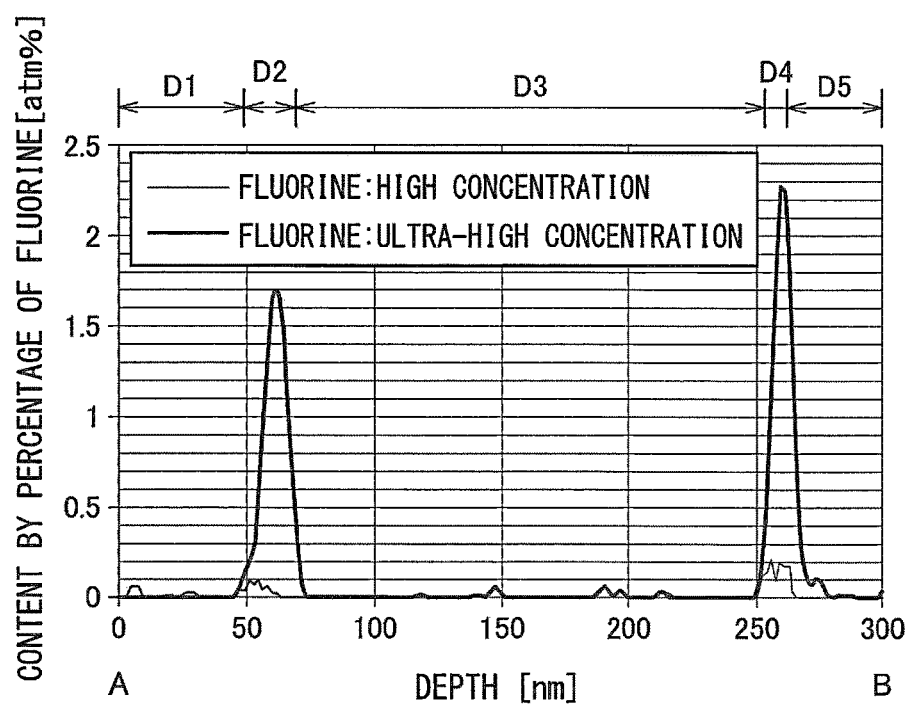

FIG. 13C is a graph illustrating the fluorine distribution in "A→B" illustrated in FIG. 13A. The horizontal axis of the graph illustrated in FIG. 13C represents the depth (nm), in which positions from A to B illustrated in FIG. 13A are indicated from the left toward the right. The vertical axis of the graph illustrated in FIG. 13C represents the content by percentage of the fluorine. The line "Fluorine: high concentration" indicates that the concentration of the fluorine contained in the insulator 20 is the same as that of the "Fluorine: high concentration" illustrated in FIG. 12. The line "Fluorine: Ultra-high concentration" indicates that the concentration of the fluorine contained in the insulator 20 is the same as that of the "Fluorine: Ultra-high concentration" illustrated in FIG. 12.

As illustrated in FIG. 13C, the content by percentage of the fluorine is about 0 (atm %) at a depth D1 where the polysilicon film 31 is present, a depth D3 where the charge holding region 21 is present, and a depth D5 where the drain region D are present. In contrast thereto, the content by percentage of the fluorine is relatively high at a depth D2 where the upper insulating film 24 is present and at a depth D4 where the tunnel insulating film 221 is present. The contents by percentage of fluorine in the tunnel insulating film 221 and the upper insulating film 24 are 0.01 (atm %) in the case of the "Fluorine: low concentration" and about 1.7 to 2.3 (atm %) in the case of the "Fluorine: Ultra-high concentration". Effects are exhibited when the content is equal to or larger than the content by percentage corresponding to that of the "Fluorine: low concentration" in FIG. 12 and 0.1 to 1 (atm %) is the optimal concentration.

As described above, the nonvolatile storage element M according to this embodiment is provided with the insulator 20 containing halogen and the charge holding region 21 surrounded by the insulator 20. Thus, the nonvolatile storage element M has excellent charge holding characteristics such that the nonvolatile storage element M can be used in an analog circuit and can improve the accuracy of the electric characteristics, such as current/voltage characteristics, when configuring an analog circuit.

Next, an analog circuit according to this embodiment is described taking the reference voltage generation circuit using the nonvolatile storage element according to this embodiment as an example. The reference voltage generation circuit as the analog circuit according to this embodiment is a circuit generating a reference voltage using a plurality of nonvolatile storage elements in which fluorine, for example, as halogen is distributed in the periphery of a floating gate region. In the reference voltage generation circuit in this embodiment, the fact that the nonvolatile storage element can be formed into two states of transistors of an enhancement type transistor and a depletion type transistor is utilized. The nonvolatile storage element to be used as the enhancement type transistor and the nonvolatile storage element to be used as the depletion type transistor have the same dimension and structure as an element and are formed so that particularly the contents by percentage of halogen in insulators are nearly equal to each other. Since the halogen present in the insulator has an effect of promoting the oxidation of the insulator and an effect of lowering the dielectric constant of the insulator, it is necessary that both the transistors have substantially the same content by percentage of the halogen. When the concentrations of the halogen in the insulators of both the transistors are greatly different from each other, a difference of the conductance or the temperature characteristics arises between the nonvolatile storage element to be used as the enhancement type transistor and the nonvolatile storage element to be used as the depletion type transistor. More specifically, there arises a problem that temperature characteristics are generated in a reference voltage generated by the reference voltage generation circuit, so that a voltage value of the reference voltage differs from a desired value. When the halogen concentrations in the insulators of both the transistors are made nearly equal to each other, this problem can be avoided. Herein, the "nearly equal" means that a difference between the halogen concentration in the insulator of the enhancement type transistor and the halogen concentration in the insulator of the depletion type transistor is within one digit.

The analog circuit according to this embodiment is a reference voltage generation circuit in which manufacturing variations in a reference voltage generated based on a difference in the characteristics of circuit elements configuring the analog circuit are eliminated. The reference voltage generation circuit in this embodiment is provided with at least one or more depletion type transistors and at least one or more enhancement type transistors in which the same current as a current flowing in the depletion type transistor or a relevant current thereto flows. The depletion type transistor and the enhancement type transistor configuring the reference voltage generation circuit in this embodiment are nonvolatile storage elements in which halogen (for example, fluorine) is distributed in all directions of the insulator surrounding the charge holding region. Herein, the "relevant current" means a current having a correlation with the current flowing in the depletion type transistor. For example, the "relevant current" is a current X times the current flowing in the depletion type transistor, a current in which a current value Y is added to the current flowing in the depletion type transistor, or a current having a more complicated relationship than that of the two examples. More specifically, the "relevant current" is a current expressed by a function in which the value of a current flowing in the depletion type transistor is set as one parameter.

Figure 14:
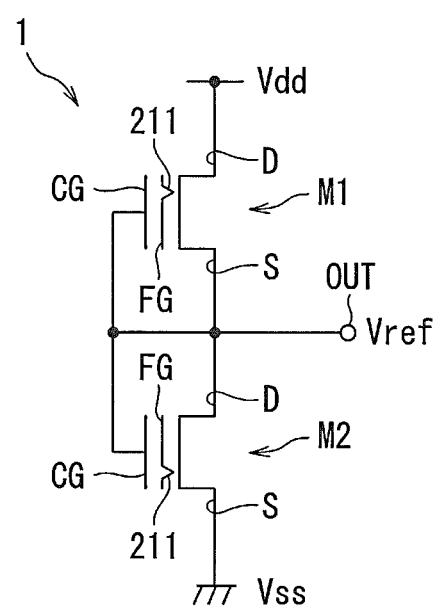
FIG. 14 is a circuit configuration diagram for explaining the reference voltage generation circuit 1 as an analog circuit according to the first embodiment of the present invention.

As illustrated in FIG. 14, the reference voltage generation circuit 1 in this embodiment is provided with a plurality (two in this example) of nonvolatile storage elements M1 and M2. At least some of the plurality of nonvolatile storage elements M1 and M2 (both the nonvolatile storage elements in this example) are connected in series and a voltage output terminal OUT outputting the reference voltage Vref is connected to a connection portion of the plurality of nonvolatile storage elements M1 and M2 connected in series. Both the nonvolatile storage element M1 and the nonvolatile storage element M2 have the FLOTOX type configuration of an N-type MOSFET and have the same configuration as that of the nonvolatile storage element M illustrated in FIG. 1.

The nonvolatile storage element M1 and the nonvolatile storage element M2 are connected in series between a high voltage supply terminal Vdd to which a high voltage is supplied and a low voltage supply terminal Vss to which a low voltage is supplied. Hereinafter, the mark "Vdd" is also used as the mark for a high voltage output from the high voltage supply terminal Vdd. The mark "Vss" is also used as the mark for a low voltage output from the low voltage supply terminal Vss. The drain region D of the nonvolatile storage element M1 is connected to the high voltage supply terminal Vdd. A source region S of the nonvolatile storage element M2 is connected to the low voltage supply terminal Vss. The source region S and the control gate region CG of the nonvolatile storage element M1 are connected to each other. The drain region D and the control gate region CG of the nonvolatile storage element M2 are connected to each other. The source region S and the control gate region CG of the nonvolatile storage element M1 and the drain region D and the control gate region CG of the nonvolatile storage element M2 are connected to each other. The voltage output terminal OUT is connected to a connection portion of the source region S of the nonvolatile storage element M1 and the drain region D of the nonvolatile storage element M2.

In the reference voltage generation circuit 1, the nonvolatile storage element M2 on the lower side (low voltage supply terminal Vss side) is adjusted to be brought into an enhancement state and the nonvolatile storage element M1 on the upper side (high voltage supply terminal Vdd side) is adjusted to be brought into a depression state. The nonvolatile storage elements M1 and M2 each have the control gate region CG and the floating gate region FG, in which fluorine is distributed as halogen in the insulator 20 (see FIG. 1) around the floating gate region FG. Thus, the nonvolatile storage elements M1 and M2 can perform writing/erasing and can hold a writing state over a long period of time. The threshold voltage of a depression type transistor becomes negative and the threshold voltage of an enhancement type transistor becomes positive. Therefore, the plurality of nonvolatile storage elements provided in the reference voltage generation circuit 1 as the analog circuit according to this embodiment contain at least the nonvolatile storage element M1 having a negative threshold voltage and the nonvolatile storage element M2 having a positive threshold voltage.

The element areas of the elements of the nonvolatile storage elements M1 and M2 provided in the reference voltage generation circuit 1 may be 10 µm² or more, may be 50 µm² or more, or may be 100 µm² or more. The nonvolatile storage elements M1 and M2 do not have an array structure even when the nonvolatile storage elements M1 and M2 have any of such element areas.

Figure 15:
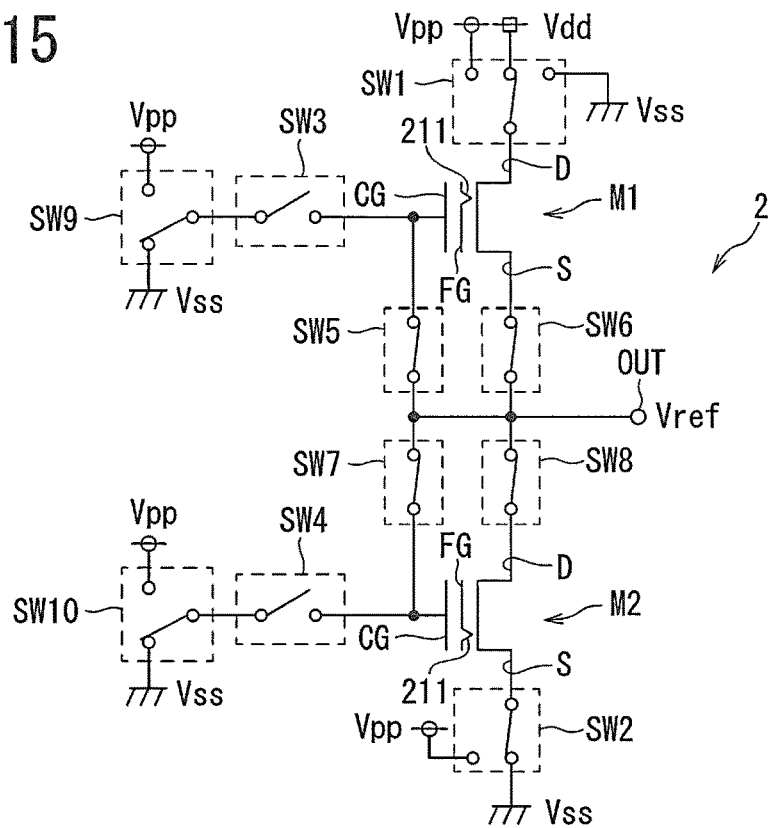
FIG. 15 is a circuit configuration diagram for explaining a reference voltage generation circuit 2 as the analog circuit according to the first embodiment of the present invention and is a view for explaining a state where the reference voltage generation circuit 2 outputs a reference voltage Vref.

As illustrated in FIG. 15, a reference voltage generation circuit 2 which is the analog circuit according to this embodiment and which can perform writing in the nonvolatile storage elements M1 and M2 is provided with a switch SW1 having one terminal connected to the drain region D of the nonvolatile storage element M1. One of the other terminals of the switch SW1 is connected to a high voltage supply terminal Vdd, another of the other terminals of the switch SW1 is connected to a low voltage supply terminal Vss, and the other one of the other terminals of the switch SW1 is connected to an application terminal of a pulse voltage Vpp. The reference voltage generation circuit 2 is configured to be able to apply either one of the high voltage Vdd, the low voltage Vss, and the pulse voltage Vpp to the drain region D of the nonvolatile storage element M1 by switching the switch SW1 as appropriate.

The reference voltage generation circuit 2 is provided with a switch SW2 having one terminal connected to the source region S of the nonvolatile storage element M2. One of the other terminals of the switch SW2 is connected to a low voltage supply terminal Vss and the other one of the other terminals of the switch SW2 is connected to an application terminal of a pulse voltage Vpp. The reference voltage generation circuit 2 is configured to be able to apply either one of the low voltage Vss or the pulse voltage Vpp to the source region S of the nonvolatile storage element M2 by switching the switch SW2 as appropriate.

The reference voltage generation circuit 2 is provided with a switch SW6 and a switch SW8 connected in series between the source region S of the nonvolatile storage element M1 and the drain region D of the nonvolatile storage element M2. The source region S of the nonvolatile storage element M1 is connected to one terminal of the switch SW6 and the drain region D of the nonvolatile storage element M2 is connected to one terminal of the switch SW8. The other terminal of the switch SW6 and the other terminal of the switch SW8 are connected.

The reference voltage generation circuit 2 is provided with a switch SW5 and a switch SW7 connected in series between the control gate region CG of the nonvolatile storage element M1 and the control gate region CG of the nonvolatile storage element M2. The control gate region CG of the nonvolatile storage element M1 is connected to one terminal of the switch SW5 and the control gate region CG of the nonvolatile storage element M2 is connected to one terminal of the switch SW7. The other terminal of the switch SW5 and the other terminal of the switch SW7 are connected.

The other terminals of the switch SW5, the switch SW6, the switch SW7, and the switch SW8 are connected to each other. The reference voltage generation circuit 2 is provided with the voltage output terminal OUT connected to a connection portion where the other terminals of the switch SW5, the switch SW6, the switch SW7, and the switch SW8 are connected to each other.

The reference voltage generation circuit 2 is provided with a switch SW3 having one terminal connected to the control gate region CG of the nonvolatile storage element M1 and a switch SW9 having one terminal connected to the other terminal of the switch SW3. One of the other terminals of the switch SW9 is connected to an application terminal of a pulse voltage Vpp and the other one of the other terminals of the switch SW9 is connected to a low voltage supply terminal Vss. The reference voltage generation circuit 2 is configured to be able to apply either one of the pulse voltage Vpp and the low voltage Vss to the control gate region 2 of the nonvolatile storage element M1 by switching the switch SW9 as appropriate when the switch SW3 is in a connection state (short-circuit state).

The reference voltage generation circuit 2 is provided with a switch SW4 having one terminal connected to the control gate region CG of the nonvolatile storage element M2 and a switch SW10 having one terminal connected to the other terminal of the switch SW4. One of the other terminals of the switch SW10 is connected to an application terminal of a pulse voltage Vpp and the other one of the other terminals of the switch SW10 is connected to a low voltage supply terminal Vss. The reference voltage generation circuit 2 is configured to be able to apply either one of the pulse voltage Vpp and the low voltage Vss to the control gate region CG of the nonvolatile storage element M2 by switching the switch SW10 as appropriate when the switch SW4 is in a connection state (short-circuit state).

As illustrated in FIG. 15, the reference voltage generation circuit 2 switches the switches SW1 to SW10 to the following states when outputting the reference voltage Vref from the voltage output terminal OUT.

Switch SW1: High voltage supply terminal Vdd side
    Switch SW2: Low voltage supply terminal Vss side
    Switch SW3, SW4: Open state (open-circuit state)
    Switches SW5, SW6, SW7, SW8: Connection state (short-circuit state)
    Switches SW9, SW10: Arbitrary (low-voltage Vss side in FIG. 15)

In the reference voltage generation circuit 2, a reference voltage Vref is generated by bringing the switches SW1 to SW10 into the switched state illustrated in FIG. 15 when the nonvolatile storage element M1 is in a depression state and the nonvolatile storage element M2 is in an enhancement state. More specifically, the reference voltage generation circuit 2 is provided with a switch portion including the switches SW1 to SW10 setting the potential of each terminal of the nonvolatile storage elements M1 and M2 to a desired potential.

Figure 16:
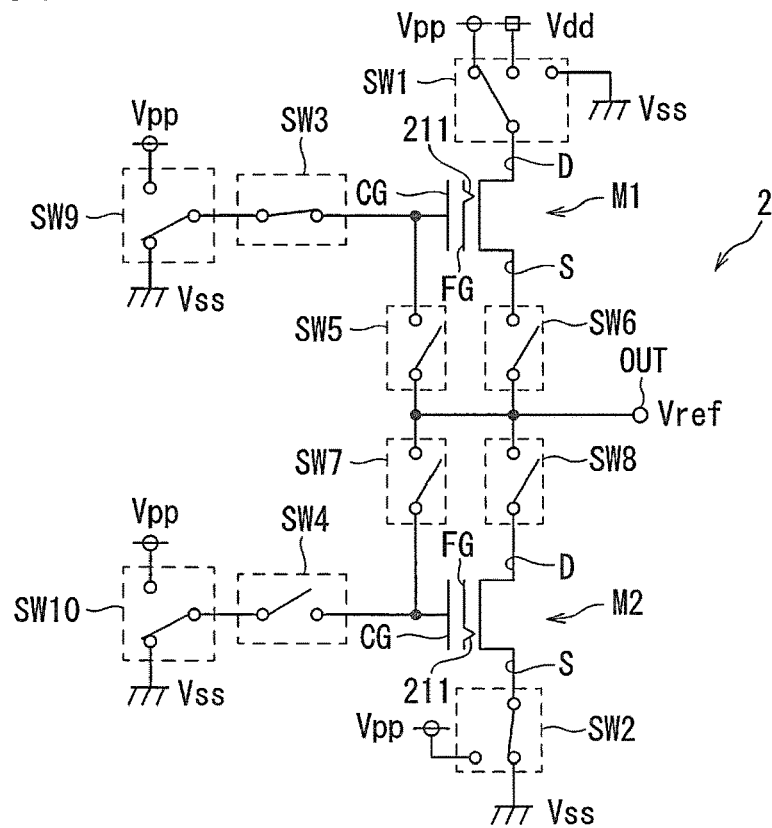
FIG. 16 is a circuit configuration diagram for explaining the reference voltage generation circuit 2 as the analog circuit according to the first embodiment of the present invention and is a view for explaining a state of adjusting a nonvolatile storage element M1 on the upper side of the reference voltage generation circuit 2 to a depletion state.

As illustrated in FIG. 16, the reference voltage generation circuit 2 switches the switches SW1 to SW10 to the following states in writing for bringing the nonvolatile storage element M1 into a depression state. Herein, a case where the threshold voltage before the adjustment on the nonvolatile storage element M1 is higher than the threshold voltage after the adjustment is taken as an example.

Switch SW1: Pulse voltage Vpp side
    Switch SW2: Low voltage supply terminal Vss side
    Switch SW3: Connection state (short-circuit state)
    Switch SW4: Open state (open-circuit state)
    Switches SW5, SW6, SW7, SW8: Open-circuit state (open-circuit state)
    Switch SW9: Low voltage supply terminal Vss side
    Switch SW10: Arbitrary (low voltage supply terminal Vss side in FIG. 16)

Therefore, the pulse voltage Vpp is applied to the drain region D of the nonvolatile storage element M1 and the low voltage Vss is applied to the control gate region CG, and therefore an electron is emitted to the drain region D from the charge holding region 21 through the charge inlet 211. Thus, the threshold voltage of the nonvolatile storage element M1 becomes low. On the contrary, when the low voltage Vss is applied to the drain region D of the nonvolatile storage element M1 and the pulse voltage Vpp is applied to the control gate region CG, an electron is injected into the charge holding region 21 from the drain region D through the charge inlet 211. Thus, the threshold voltage of the nonvolatile storage element M1 becomes high.

Figure 17:
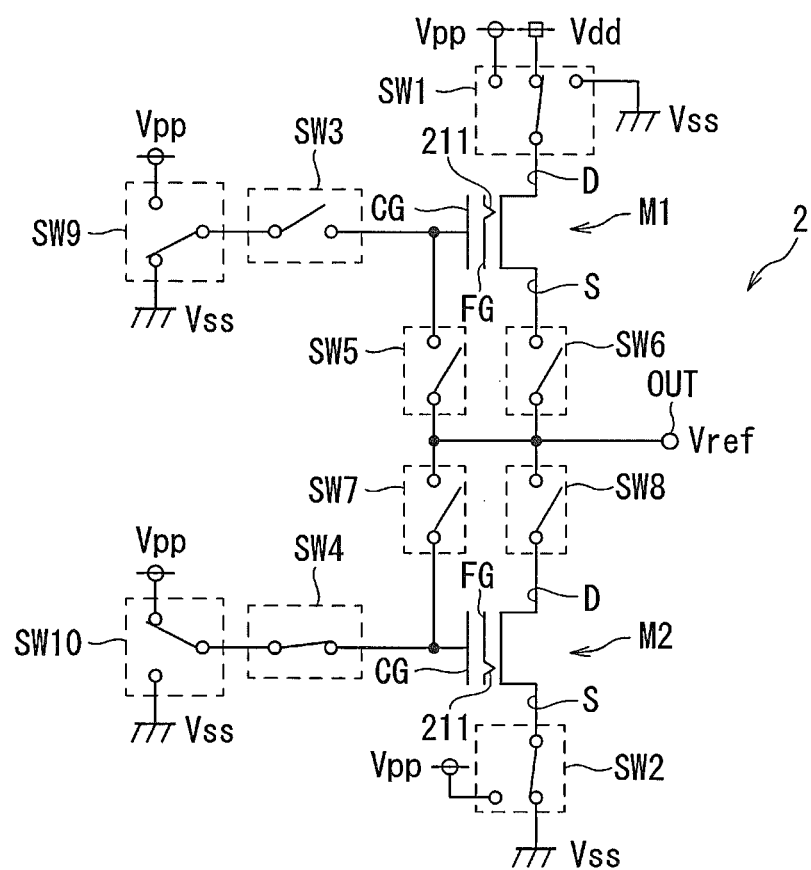
FIG. 17 is a circuit configuration diagram for explaining the reference voltage generation circuit 2 as the analog circuit according to the first embodiment of the present invention and is a view for explaining a state of adjusting a nonvolatile storage element M2 on the lower side of the reference voltage generation circuit 2 to an enhancement state.

As illustrated in FIG. 17, the reference voltage generation circuit 2 switches the switches SW1 to SW10 to the following states in writing for bringing the nonvolatile storage element M2 into an enhancement state. Herein, a case where the threshold voltage before the adjustment on the nonvolatile storage element M2 is lower than the threshold voltage after the adjustment is taken as an example.

Switch SW1: High voltage supply terminal Vdd side
Switch SW2: Low voltage supply terminal Vss side
Switch SW3: Open state (open-circuit state)
Switch SW4: Connection state (short-circuit state)
Switches SW5, SW6, SW7, SW8: Open state (open-circuit state)
Switch SW9: Arbitrary (low voltage supply terminal Vss side in FIG. 17)
Switch SW10: Pulse voltage Vpp side Therefore, the low voltage Vss is applied to the source region S of the nonvolatile storage element M2 and the pulse voltage Vpp is applied to the control gate region CG, and therefore an electron is injected into the charge holding region 21 from the source region S through the charge inlet 211. Thus, the threshold voltage of the nonvolatile storage element M2 becomes high. On the contrary, when the pulse voltage Vpp is applied to the source region S of the nonvolatile storage element M2 and the low voltage Vss is applied to the control gate region CG, an electron is emitted to the source region S from the charge holding region 21 through the charge inlet 211. Thus, the threshold voltage of the nonvolatile storage element M2 becomes low.

Figure 24:
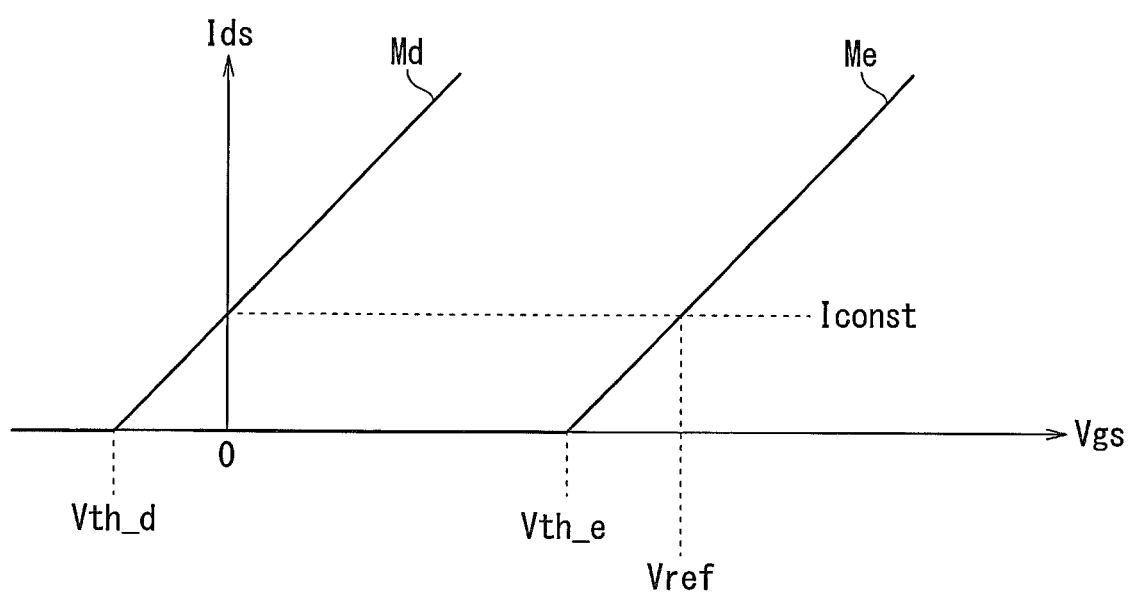
FIG. 24 is a view illustrating examples of current/voltage characteristics of a depletion type transistor Md and an enhancement type transistor Me provided in the conventional reference voltage generation circuit 100.

As illustrated in FIGS. 15 to 17, the reference voltage generation circuit 2 can generate a desired reference voltage Vref finally in a state illustrated in FIG. 15 by appropriately switching the switches SW1 to SW10 to thereby write the threshold voltages Vth of the specific nonvolatile storage elements M1 and M2 to desired values. It is a matter of course that, since the nonvolatile storage elements of the same type are used as the transistors configuring the reference voltage generation circuit in the present invention, the conductance or the temperature characteristics can be made identical in the two transistors, and therefore the ideally translated characteristics of the two transistors as illustrated in FIG. 24 can be obtained. The translated characteristics of the two transistors cannot be strictly achieved when the depletion type transistor Md and the enhancement type transistor Me are configured using different types of transistors as PTL 1 because the conductance or the temperature characteristics varies/vary in each transistor. More specifically, although temperature characteristics are generated also in the reference voltage Vref to be extracted from the voltage output terminal OUT in the reference voltage generation circuit mentioned in PTL 1, the reference voltage generation circuit of the present invention using the nonvolatile storage elements of the same type can obtain the reference voltage Vref free from manufacturing variations and temperature characteristics. Furthermore, it is also one of advantages that the reference voltage Vref to be extracted can be set to an arbitrary value by adjusting the threshold voltage Vth_e of the enhancement type transistor and the amount of a current flowing in the reference voltage generation circuit can be set to an arbitrary value by adjusting the threshold voltage Vth_d of the depletion type transistor.

As described above, this embodiment can achieve a nonvolatile storage element having high charge holding characteristics while giving flexibility to the layout of the elements. Therefore, a highly accurate analog circuit can be achieved in which the degradation of electric characteristics is effectively suppressed and the influence of manufacturing variations is very low. Moreover, according to this embodiment, variations in electric characteristics can be reduced. A nonvolatile storage element having excellent charge holding characteristics and an analog circuit provided with the same can be achieved.

Second Embodiment

A nonvolatile storage element according to this embodiment and an analog circuit provided with the same according to a second embodiment of the present invention is described using FIGS. 18 to 22. A nonvolatile storage element according to this embodiment has a configuration in which the nonvolatile storage element M illustrated in FIG. 1 and a nonvolatile storage element Mr illustrated in FIG. 18 are contained as one set, floating gate regions of the nonvolatile storage element M and the nonvolatile storage element Mr are connected, and control gate regions of the nonvolatile storage element M and the nonvolatile storage element Mr are connected.

As illustrated in FIG. 18, the nonvolatile storage element Mr has the same configuration as that of the nonvolatile storage element M except that no charge inlet is provided. The nonvolatile storage element Mr is provided with a charge holding region 71 and an insulator 70 disposed surrounding the charge holding region 71 and having halogen distributed in at least a partial region. The insulator 70 has an upper insulation film 74 formed above the charge holding region 71, a lateral wall oxide film 73 formed on the lateral wall of the charge holding region 71, and a gate insulation film 72 formed under the charge holding region 71. No tunnel insulation film is formed in the gate insulation film 72 and the film thickness is substantially constant. More specifically, a region different in the film thicknesses, such as the intentionally formed tunnel insulating film 221 as with the gate insulating film 22 in the first embodiment, is not formed in the gate insulating film 72. Since the nonvolatile storage element Mr has the same configuration as that of the nonvolatile storage element M except a point that the configuration of the insulator 70 is different from the configuration of the insulator 20, the same reference numerals are given to the constituent components exhibiting the same operations and functions and a description thereof is omitted.

Figure 19:
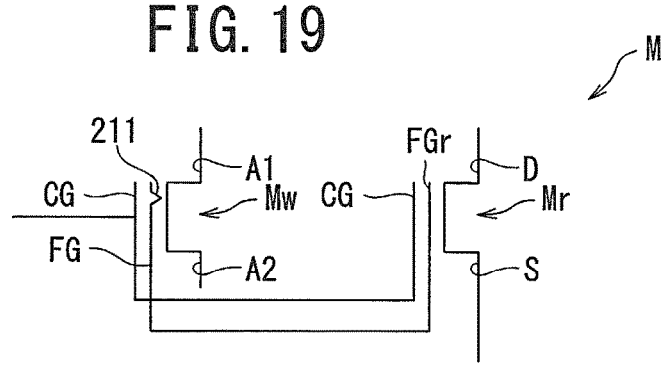
FIG. 19 is a circuit configuration diagram of the nonvolatile storage element M according to the second embodiment of the present invention.

As illustrated in FIG. 19, the nonvolatile storage element M according to this embodiment is provided with the nonvolatile storage element Mw having the same configuration as that of the nonvolatile storage element M illustrated in FIG. 1 and the nonvolatile storage element Mr illustrated in FIG. 18. The control gate region CG of the nonvolatile storage element Mw and the control gate region CG of the nonvolatile storage element Mr are connected. The floating gate region FG of the nonvolatile storage element Mw and the floating gate region FG of the nonvolatile storage element Mr are connected.

Figure 20:
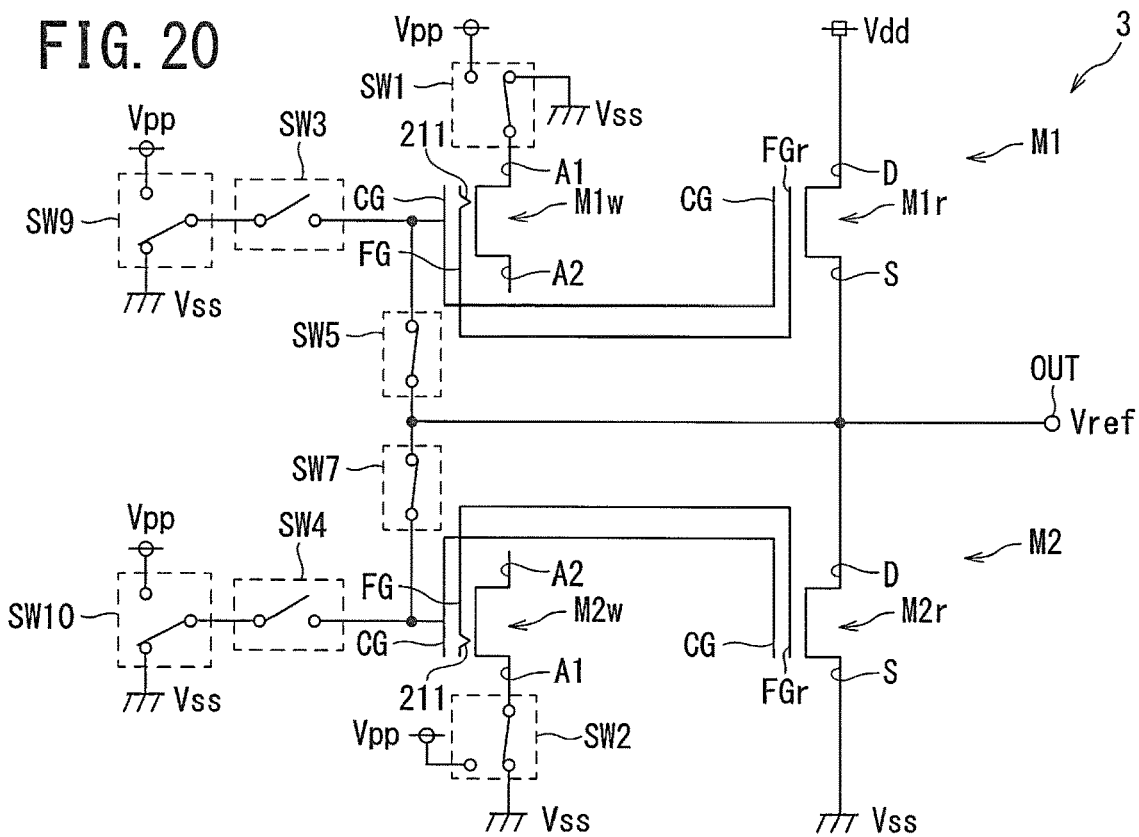
FIG. 20 is a circuit configuration diagram for explaining a reference voltage generation circuit 3 as an analog circuit according to the second embodiment of the present invention and is a view for explaining a state where the reference voltage generation circuit 3 outputs a reference voltage Vref.

As illustrated in FIG. 20, a reference voltage generation circuit 3 as the analog circuit according to this embodiment is provided with a nonvolatile storage element M1 and a nonvolatile storage element M2 connected in series. The nonvolatile storage element M1 and the nonvolatile storage element M2 each have the same configuration as that of the nonvolatile storage element M according to this embodiment illustrated in FIG. 19. The nonvolatile storage element M1 is provided with nonvolatile storage elements M1w and M1r. The nonvolatile storage element M2 is provided with nonvolatile storage elements M2w and M2r. The nonvolatile storage element M1w and the nonvolatile storage element M2w each have the same configuration as that of the nonvolatile storage element M illustrated in FIG. 1. The nonvolatile storage element M1r and the nonvolatile storage element M2r each have the same configuration as that of the nonvolatile storage element Mr illustrated in FIG. 18. Therefore, hereinafter, FIG. 18 is referred to in a description of the configurations of the nonvolatile storage elements M1r, M2r and FIG. 1 is referred to in a description of the configurations of the nonvolatile storage element M1w, M2w as necessary.

The reference voltage generation circuit 3 is provided with the nonvolatile storage elements (example of the first nonvolatile storage element) M1w, M2w and the nonvolatile storage elements (example of the second nonvolatile storage element) M1r, M2r. The nonvolatile storage element M1r has a control gate region (example of the second control gate region) CG electrically connected to a control gate region (example of the first control gate region) CG provided in a gate region of the nonvolatile storage element M1w. The nonvolatile storage element M1r has the charge holding region (example of the second charge holding region) 71 (see FIG. 18) electrically connected to the charge holding region (example of the first charge holding region) 21 (see FIG. 1) of the nonvolatile storage element M1w and the gate insulating film 72 (see FIG. 18) formed in contact with the charge holding region 71. The charge inlet 211 (see FIG. 1) provided in the nonvolatile storage element M1w is formed in a region not in contact with a current route to be formed in the nonvolatile storage element M1r. The charge inlet 211 provided in the nonvolatile storage element M1w is formed in a region not contacting the current path including the drain region D and the source region S of the nonvolatile storage element M1r.

The nonvolatile storage element M2r has a control gate region (example of the second control gate region) CG electrically connected to a control gate region (example of the first control gate region) CG provided in a gate region of the nonvolatile storage element M2w. The nonvolatile storage element M2r has the charge holding region (example of the second charge holding region) 71 (see FIG. 18) electrically connected to the charge holding region (example of the first charge holding region) 21 (see FIG. 1) of the nonvolatile storage element M2w and the gate insulating film 72 (see FIG. 18) formed in contact with the charge holding region 71. The charge inlet 211 (see FIG. 1) provided in the nonvolatile storage element M2w is formed in a region not in contact with a current route to be formed in the nonvolatile storage element M2r. The charge inlet 211 provided in the nonvolatile storage element M2w is formed in a region not contacting the current path including the drain region D and the source region S of the nonvolatile storage element M2r.

The control gate region CG of the nonvolatile storage element M1w provided in the nonvolatile storage element M1 and the control gate region CG of the nonvolatile storage element M1r provided therein are connected. A floating gate region FG of the nonvolatile storage element M1w and a floating gate region FG of the nonvolatile storage element M1r are connected. The control gate region CG of the nonvolatile storage element M2w provided in the nonvolatile storage element M2 and the control gate region CG of the nonvolatile storage element M2r provided therein are connected. A floating gate region FG of the nonvolatile storage element M2w and a floating gate region FG of the nonvolatile storage element M2r are connected.

The nonvolatile storage element M1r and the nonvolatile storage element M2r are connected in series between the high voltage supply terminal Vdd and the low voltage supply terminal Vss. More specifically, the drain region D of the nonvolatile storage element M1r is connected to the high voltage supply terminal Vdd. The source region S of the nonvolatile storage element M2r is connected to the low voltage supply terminal Vss. The source region S of the nonvolatile storage element M1r and the drain region D of the nonvolatile storage element M2r are connected.

The nonvolatile storage element M1w has a first region A1 provided in one of both sides of a lower portion of the floating gate region FG and a second region A2 provided in the other one of both the sides. The reference voltage generation circuit 3 is provided with a switch SW1 having one terminal connected to the first region A1 of the nonvolatile storage element M1w. One of the other terminals of the switch SW1 is connected to a low voltage supply terminal Vss and the other of the other terminals of the switch SW1 is connected to an application terminal of a pulse voltage Vpp. The reference voltage generation circuit 3 can apply either one of the low voltage Vss and the pulse voltage Vpp to the first region A1 of the nonvolatile storage element M1w by switching the switch SW1 as appropriate.

The nonvolatile storage element M2w has a first region A1 provided in one of both sides of a lower portion of the floating gate region FG and a second region A2 provided in the other one of both the sides. The reference voltage generation circuit 3 is provided with a switch SW2 having one terminal connected to the first region A1 of the nonvolatile storage element M2w. One of the other terminals of the switch SW2 is connected to a low voltage supply terminal Vss and the other of the other terminals of switch SW2 is connected to an application terminal of a pulse voltage Vpp. The reference voltage generation circuit 3 can apply either one of the low voltage Vss and the pulse voltage Vpp to the first region A1 of the nonvolatile storage element M2w by switching the switch SW2 as appropriate.

The reference voltage generation circuit 3 is provided with a switch SW5 and a switch SW7 connected in series between the control gate region CG of the nonvolatile storage element M1w and the control gate region CG of the nonvolatile storage element M2w. The control gate region CG of the nonvolatile storage element M1w is connected to one terminal of the switch SW5 and the control gate region CG of the nonvolatile storage element M2w is connected to one terminal of the switch SW7. The other terminals of the switch SW5 and the switch SW7 are connected to each other. The other terminals of the switch SW5 and the switch SW7 are connected to a connection portion where the source region S of the nonvolatile storage element M1r and the drain region D of the nonvolatile storage element M2r are connected to each other. The reference voltage generation circuit 3 is provided with a voltage output terminal OUT which is connected to the connection portion and from which a reference voltage Vref is output.

The reference voltage generation circuit 3 is provided with a switch SW3 having one terminal connected to the control gate region CG of the nonvolatile storage element M1w and a switch SW9 having one terminal connected to the other terminal of the switch SW3. One of the other terminals of the switch SW9 is connected to an application terminal of a pulse voltage Vpp and the other one of the other terminals of the switch SW9 is connected to a low voltage supply terminal Vss. The reference voltage generation circuit 3 can apply either one of the pulse voltage Vpp and the low voltage Vss to the control gate region CG of the nonvolatile storage element M1w by switching the switch SW9 as appropriate when the switch SW3 is in a connection state (short-circuit state).

The reference voltage generation circuit 3 is provided with a switch SW4 having one terminal connected to the control gate region CG of the nonvolatile storage element M2w and a switch SW10 having one terminal connected to the other terminal of the switch SW4. One of the other terminals of the switch SW10 is connected to an application terminal of a pulse voltage Vpp and the other one of the other terminals of the switch SW10 is connected to a low voltage supply terminal Vss. The reference voltage generation circuit 3 can apply either one of the pulse voltage Vpp and the low voltage Vss to the control gate region CG of the nonvolatile storage element M2w by switching the switch SW10 as appropriate when the switch SW4 is in a connection state (short-circuit state).

The second region A2 of the nonvolatile storage element M1w and the second region A2 of the nonvolatile storage element M2w are not connected unlike the source region S of the nonvolatile storage element M1 and the drain region D of the nonvolatile storage element M2 in the reference voltage generation circuit 2 and are in a floating state. The nonvolatile storage element M1w and the nonvolatile storage element M2w are regions present for charge injection into the floating gate region FG of the nonvolatile storage element M1r or the floating gate region FG of the nonvolatile storage element M2r and do not flow a current as a transistor. Therefore, the nonvolatile storage element M1w and the nonvolatile storage element M2w do not need to have the source region S and the drain region D and the structure is not limited insofar as they have a structure having a charge inlet.

As illustrated in FIG. 20, charges are injected into the floating gate regions FG through the nonvolatile storage elements M1w, M2w during charge injection in the reference voltage generation circuit 3. When operating the reference voltage generation circuit 3, a current flows through the nonvolatile storage elements M1r, M2r. In the reference voltage generation circuit 3, the nonvolatile storage element M1 side (i.e., nonvolatile storage elements M1w, M1r) is in a depletion state and the nonvolatile storage element M2 side (i.e., nonvolatile storage elements M2w, M2r) is in an enhancement state.

As illustrated in FIG. 20, the reference voltage generation circuit 3 switches the switches SW1 to SW5, SW7, SW9, and SW10 to the following states when generating the reference voltage Vref.
Switch SW1: Low voltage supply terminal Vss side
Switch SW2: Low voltage supply terminal Vss side
Switches SW3, SW4: Open state (open-circuit state)
Switches SW5, SW7: Connection state (short-circuit state)
Switches SW9, SW10: Arbitrary (Low voltage supply terminal Vss side in FIG. 20)

Figure 21:
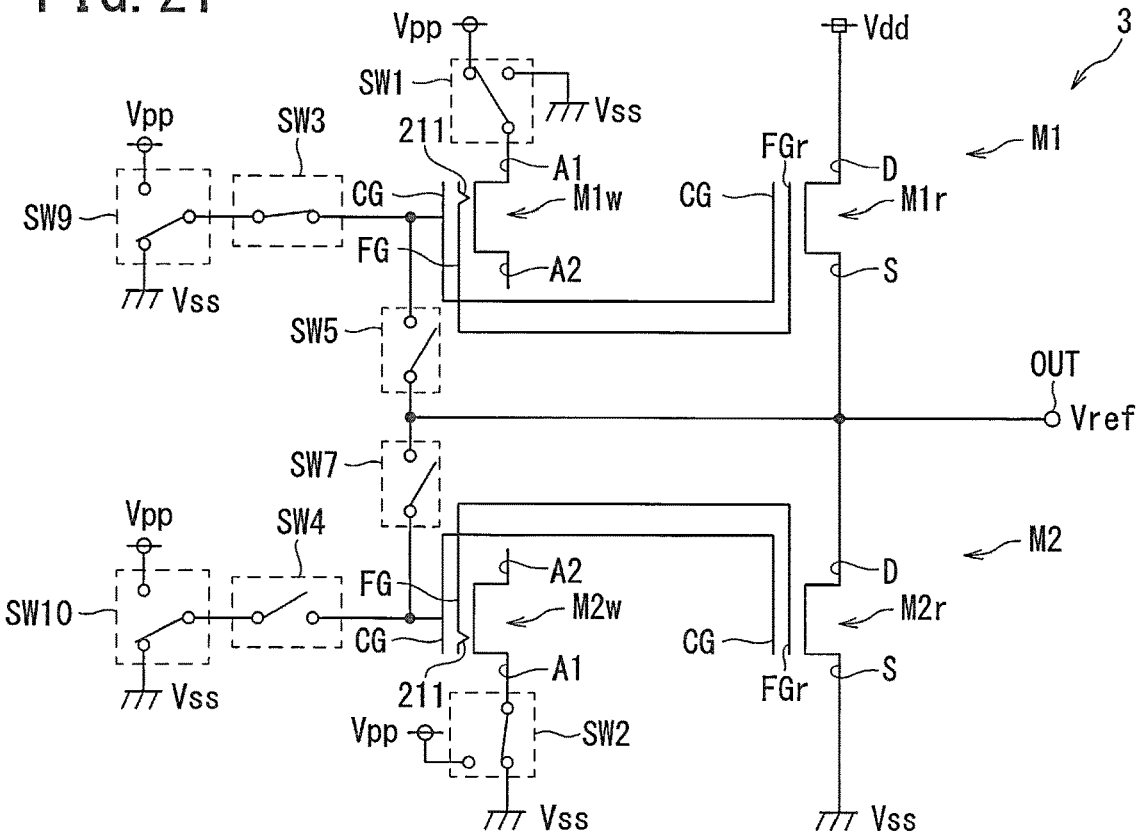
FIG. 21 is a circuit configuration diagram for explaining the reference voltage generation circuit 3 as the analog circuit according to the second embodiment of the present invention and is a view for explaining a state of adjusting a nonvolatile storage element M1 on the upper side of the reference voltage generation circuit 3 to a depletion state.

As illustrated in FIG. 21, the reference voltage generation circuit 3 switches the switches SW1 to SW5, SW7, SW9, and SW10 to the following states in performing writing for bringing the nonvolatile storage element M1 side (i.e., nonvolatile storage elements M1w, M1r) into a depletion state. Herein, a case where the threshold voltage before adjustment on the nonvolatile storage element M1 side is higher than the threshold voltage after adjustment is taken as an example.
Switch SW1: Pulse voltage Vpp side
Switch SW2: Low voltage supply terminal Vss side
Switch SW3: Connection state (short-circuit state)
Switch SW4: Open state (open-circuit state)
Switches SW5, SW7: Open state (open-circuit state)
Switch SW9: Low voltage supply terminal Vss side
Switch SW10: Arbitrary (Low voltage supply terminal Vss side in FIG. 21)

Therefore, the pulse voltage Vpp is applied to the first region A1 of the nonvolatile storage element M1w and the low voltage Vss is applied to the control gate region CG thereof, and therefore electrons are emitted to the first region A1 from the charge holding region 21 through the charge inlet 211. Thus, the threshold voltage of the nonvolatile storage element M1w becomes low. On the contrary, when the low voltage Vss is applied to the first region A1 of the nonvolatile storage element M1w and the pulse voltage Vpp is applied to the control gate region CG thereof, electrons are injected into the charge holding region 21 from the first region A1 through the charge inlet 211. Thus, the threshold voltage of the nonvolatile storage element M1w becomes high.

Figure 22:
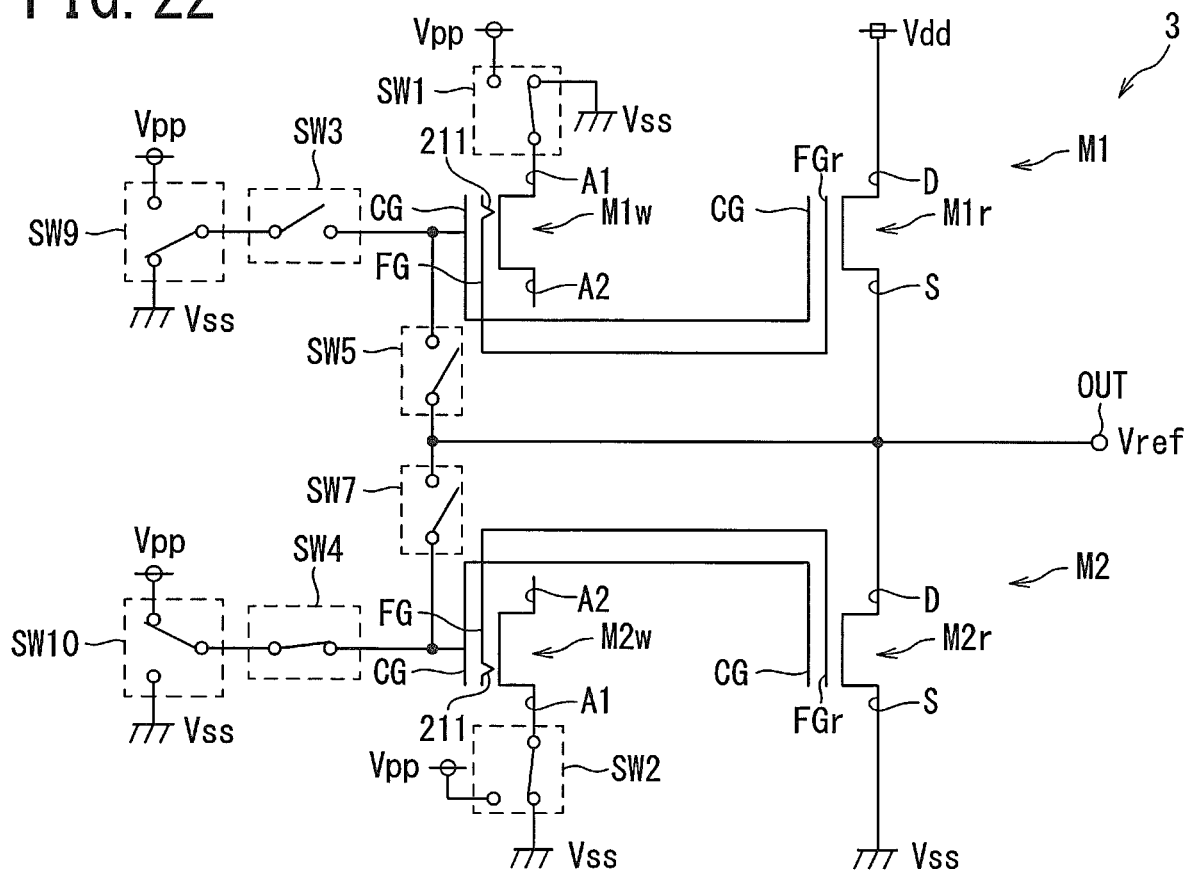
FIG. 22 is a circuit configuration diagram for explaining the reference voltage generation circuit 3 as the analog circuit according to the second embodiment of the present invention and is a view for explaining a state of adjusting a nonvolatile storage element M2 on the lower side of the reference voltage generation circuit 3 to an enhancement state.
Figure 23:
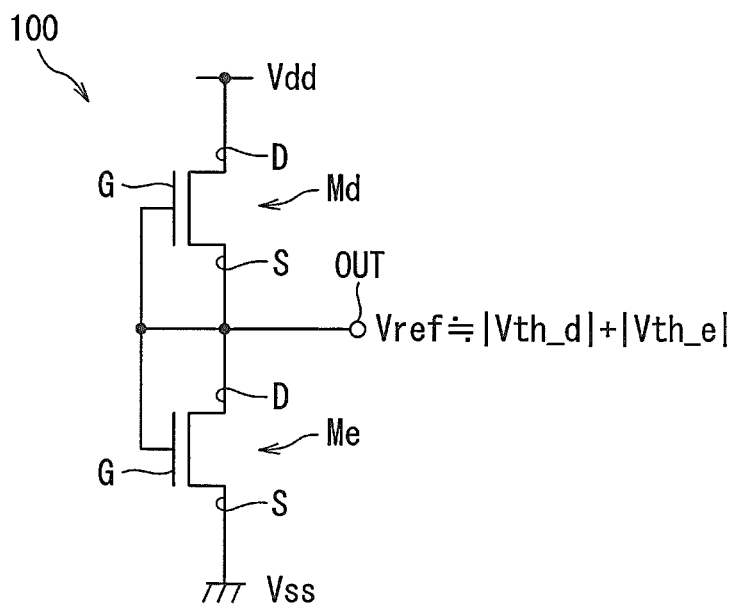
FIG. 23 is a circuit configuration diagram of a conventional reference voltage generation circuit 100.

As illustrated in FIG. 22, the reference voltage generation circuit 3 switches the switches SW1 to SW5, SW7, SW9, and SW10 to the following states in performing writing for bringing the nonvolatile storage element M2 side (i.e., nonvolatile storage elements M2w, M2r) into an enhancement state. Herein, a case where the threshold voltage before adjustment on the nonvolatile storage element M2 side is lower than the threshold voltage after adjustment is taken as an example.
Switch SW1: Low voltage supply terminal Vss side
Switch SW2: Low voltage supply terminal Vss side
Switch SW3: Open state (open-circuit state)
Switch SW4: Connection state (short-circuit state)
Switches SW5, SW7: Open state (open-circuit state)
Switch SW9: Arbitrary (Low voltage supply terminal Vss side in FIG. 25)
Switch SW10: Pulse voltage Vpp side Therefore, the low voltage Vss is applied to the first region A1 of the nonvolatile storage element M2w and the pulse voltage Vpp is applied to the control gate region CG thereof, and therefore electrons are injected into the charge holding region 21 from the first region A1 through the charge inlet 211. Thus, the threshold voltage of the nonvolatile storage element M2w becomes high. On the contrary, when the pulse voltage Vpp is applied to the first region A1 of the nonvolatile storage element M2w and the low voltage Vss is applied to the control gate region CG thereof, electrons are emitted to the first region A1 from the charge holding region 21 through the charge inlet 211. Thus, the threshold voltage of the nonvolatile storage element M2w becomes low.

As described above, this embodiment can achieve a nonvolatile storage element having high charge holding characteristics while giving flexibility to the layout of the element. Therefore, a highly accurate analog circuit can be achieved in which the degradation of the electric characteristics is effectively suppressed and the influence of manufacturing variations is very low. Moreover, according to this embodiment, variations in the electric characteristics can be reduced. A nonvolatile storage element having excellent charge holding characteristics and an analog circuit provided with the same can be achieved.

Moreover, the nonvolatile storage element and the analog circuit provided with the same according to this embodiment can adjust the threshold voltage by adjusting the charge amounts of the floating gates FG of the nonvolatile storage elements M1w, M2w, and therefore the same effects as those of the nonvolatile storage element and the analog circuit provided with the same according to the first embodiment are obtained.

The reference voltage generation circuit 3 in this embodiment is provided with the nonvolatile storage element M of the configuration illustrated in FIG. 19, and therefore the current route during the charge injection and the charge emission and the current route during the operation of the reference voltage generation circuit 3 are separable. Thus, the reference voltage generation circuit 3 can prevent unexpected writing of the nonvolatile storage element and can achieve an improvement of the reliability.

REFERENCE SIGNS LIST 1, 2, 3, 100 reference voltage generation circuit
10 P-well region
11, 13 N-type region
12, 14 N+ region
20, 70 insulator
21, 71 charge holding region
21a, 31 polysilicon film
21b fluorine existing region
22, 72 gate insulating film
22a insulating film
23 lateral oxide film
23a oxide film
24 upper insulating film
24a ONO film
25, 32 sidewall
41, 42 element isolation region
51, 52, 53 plug
61 protective film
73 lateral oxide film
74 upper insulating film
211 charge inlet
221 tunnel insulating film
221a thin film region
A1 first region
A2 second region
B back gate
CG control gate region
D drain region
FG floating gate region
G gate region
M, M1, M1r, M1w, M2, M2r, M2w, Mr, Mw nonvolatile storage element
Md depletion type transistor
Me enhancement type transistor
S source region

What is claimed is:

1. A nonvolatile storage element comprising:
a substrate;
a gate region having a charge holding region and an insulator surrounding an entire surface of the charge holding region;
a drain region formed in one of both sides of a lower portion of the gate region; and
a source region formed in another one of both the sides,
wherein a halogen is distributed in the insulator to cover an entire surface of an upper surface of the charge holding region.

2. The nonvolatile storage element according to claim 1, wherein the halogen is distributed in the insulator to cover at least one part of a lower surface of the charge holding region.

3. The nonvolatile storage element according to claim 1, wherein the halogen is distributed in the insulator to cover an entire surface of the lower surface of the charge holding region.

4. The nonvolatile storage element according to claim 1, wherein the halogen is fluorine.

5. The nonvolatile storage element according to claim 1, wherein a content by percentage of the halogen in the insulator is 0.01 atm % or more in at least a part of the region in contact with the charge holding region.

6. The nonvolatile storage element according to claim 5, wherein the content by percentage of the halogen in the insulator is 0.05 atm % or more.

7. The nonvolatile storage element according to claim 5, wherein the content by percentage of the halogen in the insulator is 0.1 atm % or more.

8. The nonvolatile storage element according to claim 5, wherein the content by percentage of the halogen in the insulator is 2.3 atm % or less.

9. The nonvolatile storage element according to claim 1, wherein the insulator has a plurality of regions having different film thicknesses on the lower surface side of the charge holding region.

10. The nonvolatile storage element according to claim 9, wherein the halogen is distributed in a region where film thickness is the thinnest among plurality of regions having different film thicknesses.

11. The nonvolatile storage element according to claim 9, wherein the halogen is distributed in all of the plurality of regions having different film thicknesses.

12. The nonvolatile storage element according to claim 1, wherein the substrate is a silicon substrate.

13. The nonvolatile storage element according to claim 1, wherein the charge holding region is made of a polysilicon.

14. An analog circuit comprising the nonvolatile storage element according to claim 1.

15. The analog circuit according to claim 14, comprising:
two or more of the nonvolatile storage elements,
wherein
at least some of the two or more of the nonvolatile storage elements are connected in series, and
a voltage output terminal, from which a voltage is output, is connected to a connection portion of the two or more of the nonvolatile storage elements connected in series.

16. The analog circuit according to claim 15, wherein the two or more of the nonvolatile storage elements contain at least a nonvolatile storage element having a negative threshold voltage and a nonvolatile storage element having a positive threshold voltage.

17. The analog circuit according to claim 15, wherein a contents by percentage of the halogen of the two or more of the nonvolatile storage elements connected in series are nearly equal to each other.

18. The analog circuit according to claim 14 comprising:
a second nonvolatile storage element having:
a second control gate region electrically connected to a first control gate region provided in a gate region having the charge holding region and the insulator of a first nonvolatile storage element which is the nonvolatile storage element;

a second charge holding region electrically connected to a first charge holding region which is the charge holding region of the first nonvolatile storage element; and a gate insulating film formed in contact with the second charge holding region, wherein a charge inlet provided in the first nonvolatile storage element is formed in a region not in contact with a current route formed in the second nonvolatile storage element.

19. The analog circuit according to claim 14, wherein an element area of the nonvolatile storage element is 10 $\mu m^2$ or more, and the nonvolatile storage element does not have an array structure.

20. The analog circuit according to claim 19, wherein the element area of the nonvolatile storage element is 50 $\mu m^2$ or more.

* * * * *